United States Patent
Ching et al.

(10) Patent No.: US 10,157,799 B2
(45) Date of Patent: Dec. 18, 2018

(54) MULTI-GATE DEVICE AND METHOD OF FABRICATION THEREOF

(71) Applicant: Taiwan Semiconductor Manufacturing Company, Ltd., Hsin-Chu (TW)

(72) Inventors: Kuo-Cheng Ching, Hsinchu County (TW); Ching-Wei Tsai, Hsin-Chu (TW); Carlos H Diaz, Mountain View, CA (US); Chih-Hao Wang, Hsinchu County (TW); Wai-Yi Lien, Hsinchu (TW); Ying-Keung Leung, Hsinchu County (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/880,584

(22) Filed: Jan. 26, 2018

(65) Prior Publication Data
US 2018/0151450 A1    May 31, 2018

Related U.S. Application Data

(62) Division of application No. 14/983,816, filed on Dec. 30, 2015, now Pat. No. 9,899,269.

(51) Int. Cl.
*H01L 21/8238* (2006.01)
*H01L 29/423* (2006.01)
*H01L 27/092* (2006.01)
*H01L 21/78* (2006.01)
*H01L 21/8234* (2006.01)

(52) U.S. Cl.
CPC ........... *H01L 21/823821* (2013.01); *H01L 21/823412* (2013.01); *H01L 21/823418* (2013.01); *H01L 21/823807* (2013.01); *H01L 21/823814* (2013.01); *H01L 27/0924* (2013.01); *H01L 29/42392* (2013.01)

(58) Field of Classification Search
CPC .............. H01L 21/823821; H01L 29/42392
See application file for complete search history.

(56) References Cited

U.S. PATENT DOCUMENTS

| 7,425,740 | B2 | 9/2008 | Liu et al. |
| 7,667,271 | B2 | 2/2010 | Yu et al. |
| 7,910,453 | B2 | 3/2011 | Xu et al. |
| 8,048,723 | B2 | 11/2011 | Chang et al. |

(Continued)

*Primary Examiner* — Moazzam Hossain
*Assistant Examiner* — Long H Le
(74) *Attorney, Agent, or Firm* — Haynes and Boone, LLP

(57) ABSTRACT

A method of semiconductor device fabrication is described that includes forming a first fin extending from a substrate. The first fin has a source/drain region and a channel region and the first fin is formed of a first stack of epitaxial layers that includes first epitaxial layers having a first composition interposed by second epitaxial layers having a second composition. The method also includes removing the second epitaxial layers from the source/drain region of the first fin to form first gaps, covering a portion of the first epitaxial layers with a dielectric layer and filling the first gaps with the dielectric material and growing another epitaxial material on at least two surfaces of each of the first epitaxial layers to form a first source/drain feature while the dielectric material fills the first gaps.

20 Claims, 30 Drawing Sheets

(56) References Cited

U.S. PATENT DOCUMENTS

| | | |
|---|---|---|
| 8,053,299 B2 | 11/2011 | Xu |
| 8,183,627 B2 | 5/2012 | Currie |
| 8,377,779 B1 | 2/2013 | Wang |
| 8,399,931 B2 | 3/2013 | Liaw et al. |
| 8,415,718 B2 | 4/2013 | Xu |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,652,894 B2 | 2/2014 | Lin et al. |
| 8,686,516 B2 | 4/2014 | Chen et al. |
| 8,703,565 B2 | 4/2014 | Chang et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,742,509 B2 | 6/2014 | Lee et al. |
| 8,772,109 B2 | 7/2014 | Colinge |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,860,148 B2 | 10/2014 | Hu et al. |
| 2004/0063286 A1 | 4/2004 | Kim et al. |
| 2007/0196973 A1 | 8/2007 | Park |
| 2010/0059807 A1 | 3/2010 | Cho et al. |
| 2012/0138886 A1 | 6/2012 | Kuhn et al. |
| 2013/0234215 A1* | 9/2013 | Okano ............. H01L 29/42392 257/255 |
| 2013/0285153 A1 | 10/2013 | Lee et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2017/0194213 A1 | 7/2017 | Ching et al. |

* cited by examiner

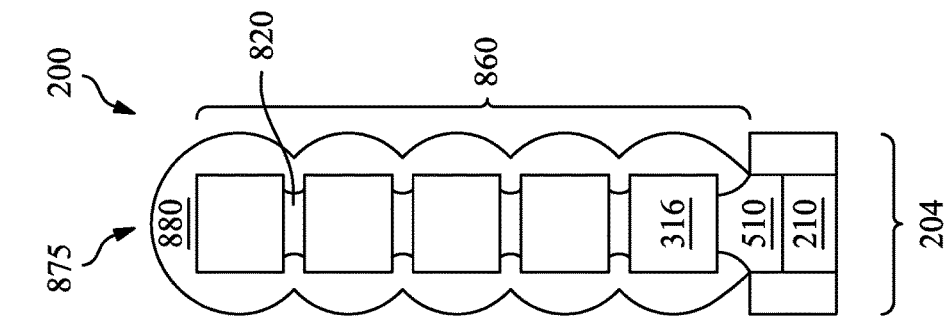
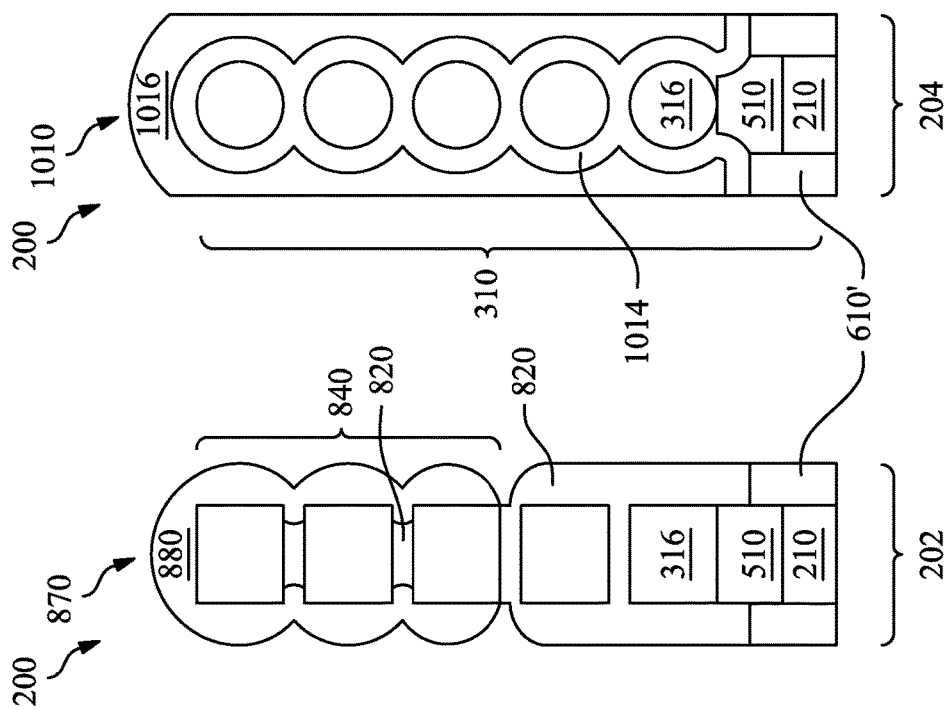

MULTI-GATE DEVICE AND METHOD OF FABRICATION THEREOF

PRIORITY DATA

The present application is a divisional application of U.S. application Ser. No. 14/983,816, filed Dec. 30, 2015, which is incorporated herein by reference in its entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the gate-all around transistor (GAA). The GAA device gets its name from the gate structure which can extend around the channel region providing access to the channel on two or four sides. GAA devices are compatible with conventional complementary metal-oxide-semiconductor (CMOS) processes and their structure allows them to be aggressively scaled while maintaining gate control and mitigating SCEs. In conventional processes, GAA devices provide a channel in a silicon nanowire. However, integration of fabrication of the GAA features around the nanowire can be challenging. For example, while the current methods have been satisfactory in many respects, continued improvements are still needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20B is a cross-section views, corresponding to the isometric view of FIG. 19A along line B-B, of an embodiment of the device 200 according to aspects of the method of FIG. 1.

FIG. 20C is a cross-section views, corresponding to the isometric view of FIG. 19A along line BB-BB, of an embodiment of the device 200 according to aspects of the method of FIG. 1.

FIG. 20D is a cross-section views, corresponding to the isometric view of FIG. 19B along line B-B, of an embodiment of the device 200 according to aspects of the method of FIG. 1.

FIG. 20E is a cross-section views, corresponding to the isometric view of FIG. 19B along line BB-BB, of an embodiment of the device 200 according to aspects of the method of FIG. 1.

DETAILED DESCRIPTION

Figure 1:
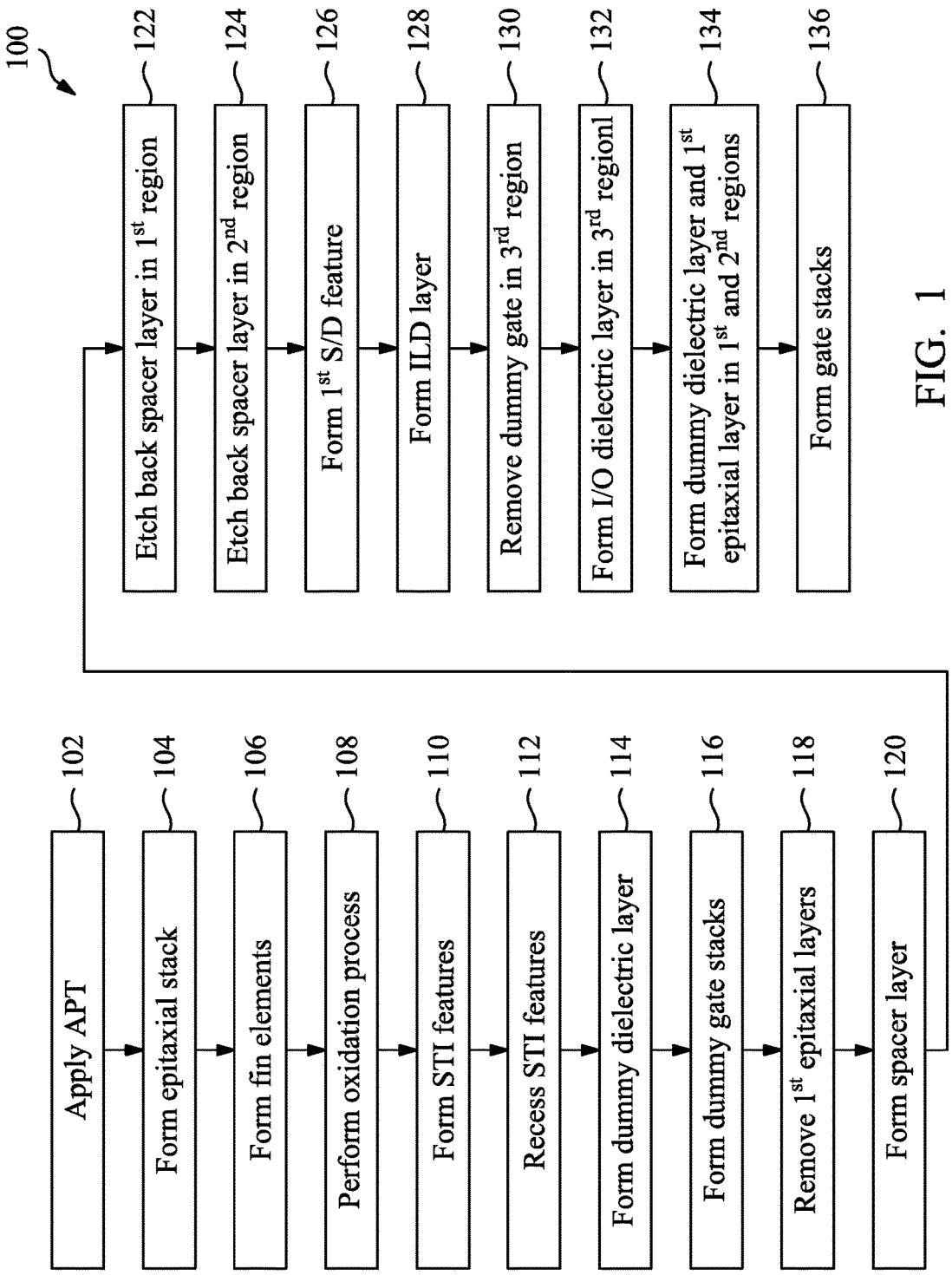
FIG. 1 is a flow chart of a method of fabricating a multi-gate device or portion provided according to one or more aspects of the present disclosure and including an isolation region under the gate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors. Multi-gate transistors include those transistors whose gate structures are formed on at least two-sides of a channel region. These multi-gate devices may include a P-type metal-oxide-semiconductor device or an N-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configuration. Presented herein are embodiments of devices that may have one or more channel regions (e.g., nanowires) associated with a single, contiguous gate structure. However, one of ordinary skill would recognize that the teachings described herein apply to a single channel (e.g., single nanowire) or any number of channels.

FIG. 1 is a method 100 of semiconductor fabrication including fabrication of multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on at least four sides of at least one channel of the device. The channel region may be referred to as a "nanowire," which as used herein includes channel regions of various geometries (e.g., cylindrical, bar-shaped) and various dimensions.

FIGS. 2-10, 11A, and 12-19C are isometric views of an embodiment of a semiconductor device 200 according to various stages of method 100 of FIG. 1. FIGS. 11B and 20A-20H are cross-section views, corresponding to respective isometric views listed above, of an embodiment of the semiconductor device 200 according to various stages of method 100 of FIG. 1. As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of method 100, including any descriptions given with reference to FIGS. 2-20H, as with the remainder of the method and exemplary figures provided in this disclosure, are merely exemplary and are not intended to be limiting beyond what is specifically recited in the claims that follow.

In the present embodiment, based on device performance considerations, the device 200 includes a first region 202, a second region 204 and a third region 206. In the first region 202, a first S/D feature will be formed and in the second region 204, a second S/D feature will be formed, which is different than the first S/D feature. The third region 206 includes an input/output (I/O) region.

Figure 2:
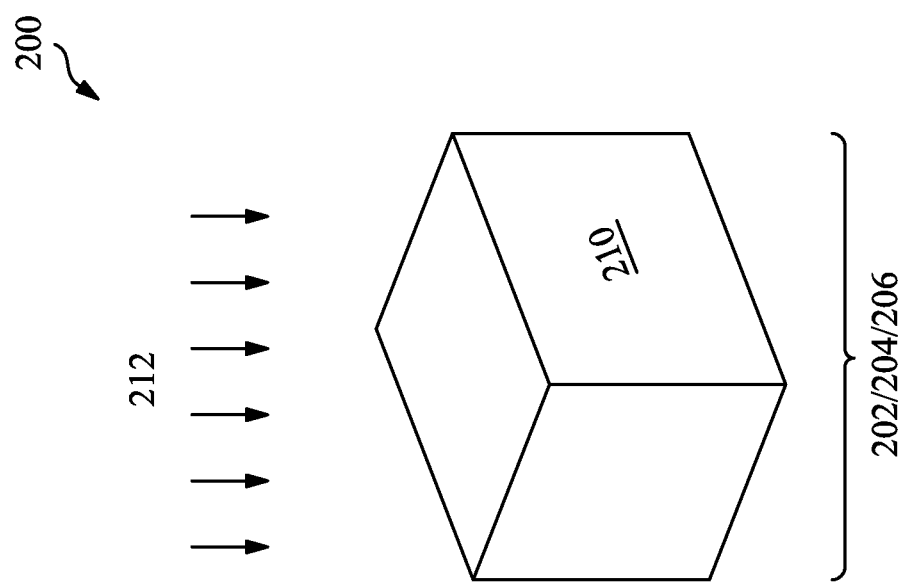
FIGS. 2, 3, 4, 5, 6, 7, 8, 9, 10 and 11A are isometric views of an embodiment of a device 200 according to aspects of the method of FIG. 1.

Referring to FIGS. 1 and 2, method 100 begins at step 102 by applying an anti-punch through (APT) implant 212 to a substrate 210, including to the first, second and third regions. In some embodiments, the substrate 210 may be a semiconductor substrate such as a silicon substrate. The substrate 210 may include various layers, including conductive or insulating layers formed on a semiconductor substrate. The substrate 210 may include various doping configurations depending on design requirements as is known in the art. For example, different doping profiles (e.g., n wells, p wells) may be formed on the substrate 210 in regions designed for different device types (e.g., n-type field effect transistors (NFET), p-type field effect transistors (PFET)). The suitable doping may include ion implantation of dopants and/or diffusion processes. The substrate 210 typically has isolation features (e.g., shallow trench isolation (STI) features) interposing the regions providing different device types. The substrate 210 may also include other semiconductors such as germanium, silicon carbide (SiC), silicon germanium (SiGe), or diamond. Alternatively, the substrate 210 may include a compound semiconductor and/or an alloy semiconductor. Further, the substrate 210 may optionally include an epitaxial layer (epi-layer), may be strained for performance enhancement, may include a silicon-on-insulator (SOI) structure, and/or have other suitable enhancement features.

The APT implant 212 may be performed in a region underlying the channel region of a device for example, to prevent punch-through or unwanted diffusion. In some embodiments, a first photolithography (photo) step is performed to pattern a P-type APT region and a second photo step is performed to pattern an N-type APT region. For example, in some embodiments, performing the first photo step may include forming a photoresist layer (resist) over the substrate 210, exposing the resist to a pattern (e.g., P-type APT implant mask), performing post-exposure bake processes, and developing the resist to form a patterned resist layer. By way of example, a P-type dopant implanted via the ion implantation process to form the P-type APT region may include boron, aluminum, gallium, indium, and/or other P-type acceptor material. Thereafter, in some embodiments, the second photo step may be performed, where the second photo step may include forming a resist layer over the substrate 210, exposing the resist to a pattern (e.g., N-type APT implant mask), performing post-exposure bake processes, and developing the resist to form a patterned resist layer. By way of example, an N-type dopant implanted via the ion implantation process into the N-type APT region may include arsenic, phosphorous, antimony, or other N-type donor material. Additionally, in various embodiments, an APT implant may have a high dopant concentration, for example, of between about $1\times10^{18}$ cm$^{-3}$ and $1\times10^{19}$ cm$^{-3}$. In some embodiments, such a high APT dopant concentration may be advantageously used, as described below, because of the presence of a subsequently formed isolation layer over the APT-implanted substrate, which can serve as a dopant diffusion barrier.

Figure 3:
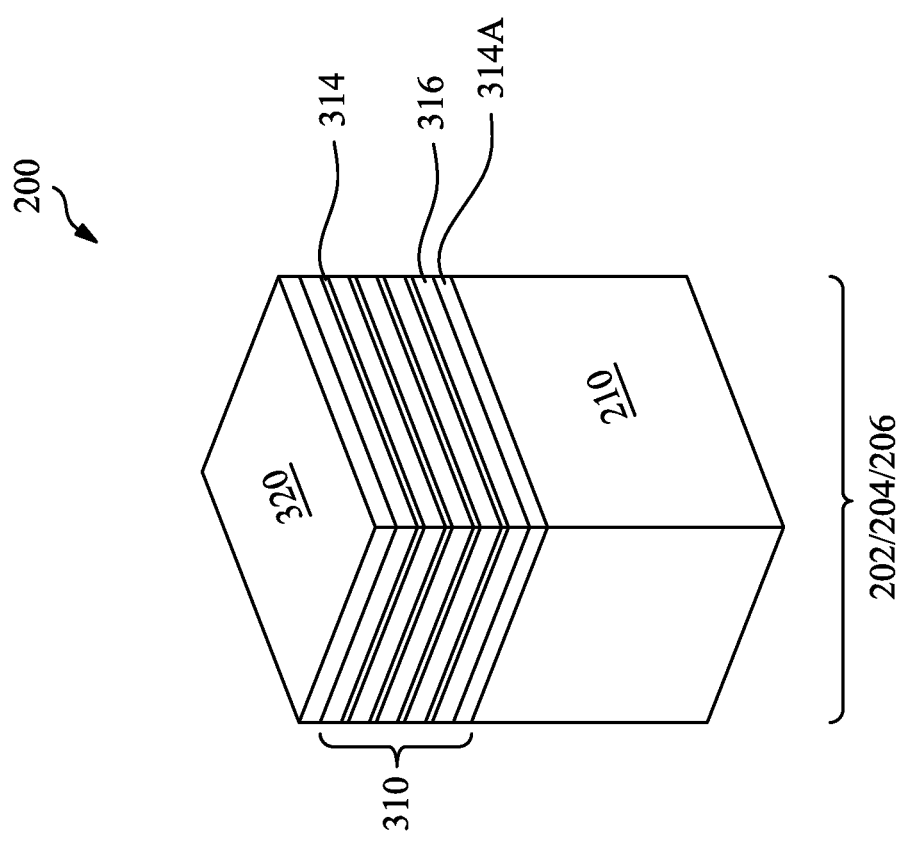

Referring to FIGS. 1 and 3, method 100 proceeds to step 104 by forming an epitaxial stack 310 over the APT-implanted substrate 210, including over the first, second and third regions, 202, 204 and 206. The epitaxial stack 310 includes first epitaxial layers 314 of a first composition interposed by second epitaxial layers 316 of a second composition. The first and second composition may be different or may be the same. In an embodiment, the first epitaxial layers 314 are formed of SiGe and the second epitaxial layers 316 are formed of silicon. However, other embodiments are possible including those that provide for a first composition and a second composition having different oxidation rates. For example, in various embodiments, the first epitaxial layer 314 has a first oxidation rate, and the second epitaxial layer 314 has a second oxidation rate less than the first oxidation rate. In some embodiments, the first epitaxial layer 314 includes SiGe and where the second epitaxial layer 316 includes Si, the Si oxidation rate of the second epitaxial layer 316 is less than the SiGe oxidation rate of the first epitaxial layer 314. During a subsequent oxidation process, as discussed below, the portions the first epitaxial layer 314 may be fully oxidized, while only the second epitaxial layer 316 may be non-oxidized, or in some embodiments oxidized only slightly (e.g., sidewalls).

It is noted that the bottom-most epitaxial layer is denoted 314A for ease of reference in later process steps. In embodiments however, the epitaxial layer 314A is substantially similar material to the first epitaxial layers 314. In an embodiment, the epitaxial layer 314A is SiGe and the first epitaxial layers 314 may also be SiGe. In other embodiments, the epitaxial layer 314A has a different composition than the first epitaxial layers 314 and/or second epitaxial layers 316. The thickness of the epitaxial layer 314A may be greater than that of the overlying first epitaxial layers 314.

The second epitaxial layers 316 or portions thereof may form a channel region of the multi-gate device 200. For example, the second epitaxial layers 316 may be referred to as "nanowires" used to form a channel region of a multi-gate device 200 such as a GAA device. These "nanowires" are also used to form a portion of the source/drain features of the multi-gate device 200 as discussed below. Again, as the term is used herein, "nanowires" refers to semiconductor layers that are cylindrical in shape as well as other configurations such as, bar-shaped. The use of the second epitaxial layers 316 to define a channel or channels of a device is further discussed below.

It is noted that five (5) layers of each of first epitaxial layers 314 (including 314A) and the second epitaxial layers 316 are illustrated in FIG. 3, this is for illustrative purposes only and not intended to be limiting. It can be appreciated that any number of epitaxial layers can be formed in the epitaxial stack 310, the number of layers depending on the desired number of channels regions for the device 200. In some embodiments, the number of second epitaxial layers 316 is between 2 and 10.

In some embodiments, the first epitaxial layer 314 has a thickness range of about 2 nanometers (nm) to about 6 nm. The first epitaxial layers 314 may be substantially uniform in thickness. In some embodiments, the epitaxial layer 314A has a thickness of approximately 8 to 15 nm while the first epitaxial layers 314 there above has a thickness ranging from about 2 nm to about 6 nm. In some embodiments, the second epitaxial layer 316 has a thickness range of about 6 nm to about 12 nm. In some embodiments, the second epitaxial layers 316 are substantially uniform in thickness. As described in more detail below, each of the second epitaxial layers 316 may serve as channel region(s) for a subsequently-formed multi-gate device and its thickness chosen based on device performance considerations. The first epitaxial layer 314 may serve to define a gap distance between adjacent channel region(s) for a subsequently-formed multi-gate device and its thickness chosen based on device performance considerations.

By way of example, epitaxial growth of the layers of the epitaxial stack 310 may be performed by a molecular beam epitaxy (MBE) process, a metalorganic chemical vapor deposition (MOCVD) process, and/or other suitable epitaxial growth processes. In some embodiments, the epitaxially grown layers such as, the second epitaxial layers 316 include the same material as the substrate 210. In some embodiments, the first and second epitaxially grown layers, 314 and 316, include a different material than the substrate 210. As stated above, in at least some examples, the first epitaxial layer 314 includes an epitaxially grown silicon germanium (SiGe) layer and the second epitaxial layer 316 includes epitaxially grown silicon (Si) layer. In some embodiments, the epitaxial layer 314A is also SiGe. Alternatively, in some embodiments, either of the first and second epitaxial layers, 314 and 316, may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the first and second epitaxial layers, 314 and 316, may be chosen based on providing differing oxidation, etch selectivity properties. In various embodiments, the first and second epitaxial layers, 314 and 316, are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

As also shown in the example of FIG. 3, a hard mask (HM) layer 320 may be formed over the epitaxial stack 310. In some embodiments, the HM layer 320 includes an oxide layer (e.g., a pad oxide layer that may include $SiO_2$) and nitride layer (e.g., a pad nitride layer that may include $Si_3N_4$) formed over the oxide layer. In some examples, the HM layer 320 includes thermally grown oxide, chemical vapor deposition (CVD)-deposited oxide, and/or atomic layer deposition (ALD)-deposited oxide. In some embodiments, the HM layer 320 includes a nitride layer deposited by CVD or other suitable technique. The HM layer 320 may be used to protect portions of the substrate 210 and/or epitaxial stack 310 and/or used to define a pattern (e.g., fin elements) as discussed below.

Figure 4:
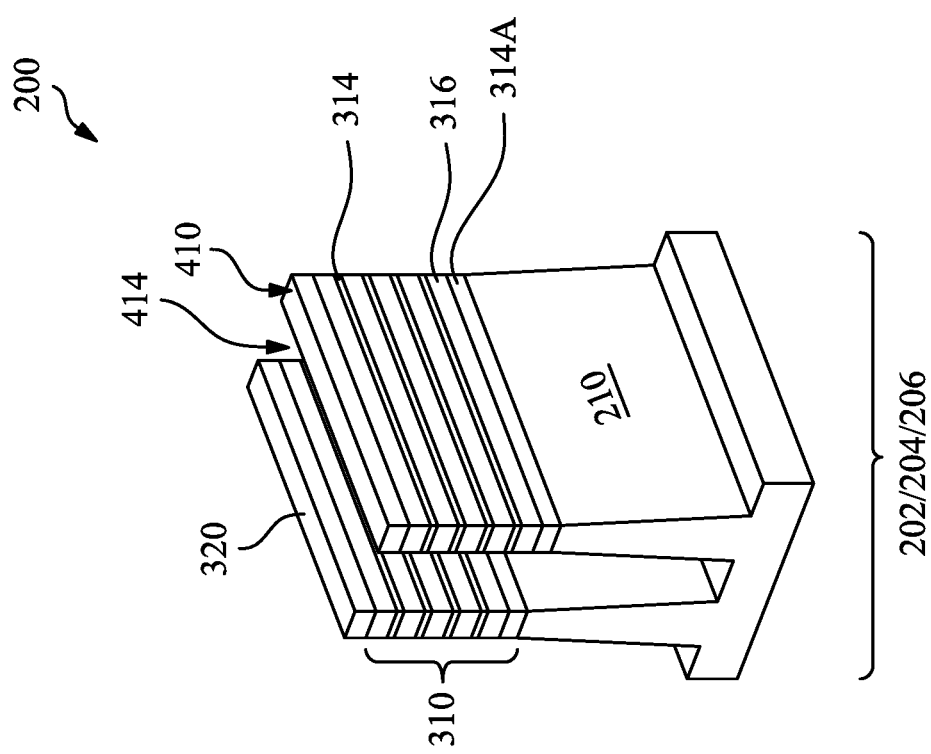

Referring to FIGS. 1 and 4, method 100 proceeds to step 106 by forming a plurality of fin elements 410 (referred to as fins) extending from the substrate 210 (including in the first, second and third regions, 202, 204 and 206). In various embodiments, each of the fins 410 includes a substrate portion formed from the substrate 210, portions of each of the epitaxial layers of the epitaxial stack including epitaxial layers 314/314A and 316, and an HM layer portion from the HM layer 320.

The fins 410 may be fabricated using suitable processes including photolithography and etch processes. The photolithography process may include forming a photoresist layer over the substrate 210 (e.g., over the HM layer 320 of FIG. 3), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 210, and layers formed thereupon, while an etch process forms trenches 414 in unprotected regions through the HM layer 320, through the epitaxial stack 310, and into the substrate 210, thereby leaving the plurality of extending fins 410. The trenches 414 may be etched using a dry etch (e.g., reactive ion etching), a wet etch, and/or combination thereof.

Numerous other embodiments of methods to form the fins on the substrate may also be used including, for example, defining the fin region (e.g., by mask or isolation regions) and epitaxially growing the epitaxial stack 310 in the form of the fin 410. In some embodiments, forming the fins 410 may include a trim process to decrease the width of the fins 410. The trim process may include wet and/or dry etching processes.

Figure 5:
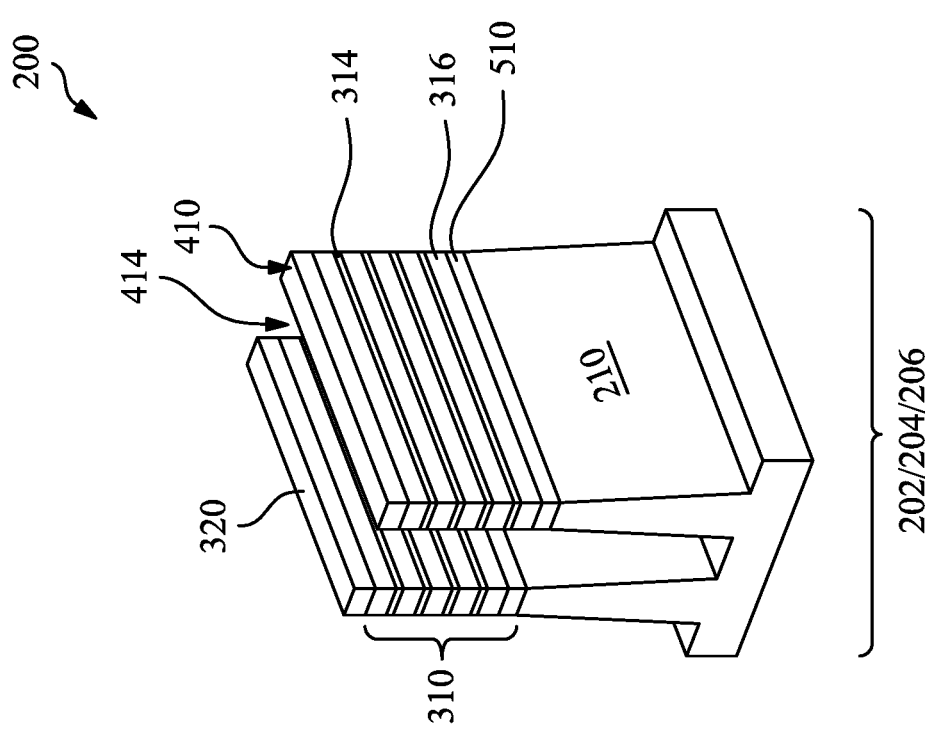

Referring to FIGS. 1 and 5, method 100 proceeds to step 108 by performing an oxidation process to form an isolation region within the fin element(s) (including in the first, second and third regions, 202, 204 and 206). The device 200 is exposed to an oxidation process that fully oxidizes the epitaxial layer portion 314A of each of the plurality of fins 410. The epitaxial layer portion 314A is transformed into an oxidized layer 510, which provides an isolation region/layer. In some embodiments, the oxidized layer 510 has a thickness range of about 5 to about 25 nanometers (nm). In an embodiment, the oxidized layer 510 may include an oxide of silicon germanium (SiGeOx).

The oxidation process may include forming and patterning various masking layers such that the oxidation is controlled to the epitaxial layer 314A. In other embodiments, the oxidation process is a selective oxidation due to the composition of epitaxial layer 314A. In some examples, the oxidation process may be performed by exposing the device 200 to a wet oxidation process, a dry oxidation process, and/or a combination thereof. In at least some embodiments, the device 200 is exposed to a wet oxidation process using water vapor or steam as the oxidant, at a pressure of about 1 ATM, within a temperature range of about 400° C. to about 600° C., and for a time from about 0.5 hours to about 2 hours. It is noted that the oxidation process conditions provided herein are merely exemplary, and are not meant to be limiting.

As described above, in some embodiments, the first epitaxial layer portion 314A may include a material having a first oxidation rate, and the second epitaxial layer 316 may include a material having a second oxidation rate less than the first oxidation rate. By way of example, in embodiments where the first epitaxial layer portion 314A includes SiGe, and where the second epitaxial layer portion 316 includes Si, the faster SiGe oxidation rate (i.e., as compared to Si) ensures that the SiGe layer (i.e., the epitaxial layer portion 314A) becomes fully oxidized while minimizing or eliminating the oxidization of other epitaxial layers 316. It will be understood that any of the plurality of materials discussed above may be selected for each of the first and second epitaxial layer portions that provide different suitable oxidation rates.

The resultant oxidized layer 510 of each of the fins 410 can serve as a diffusion barrier to APT dopants previously implanted into the substrate 210, and which may be present in the substrate 210 directly below the oxidized layer 510. Thus, in various embodiments, the oxidized layer 510 prevents APT dopants within the substrate portion 210 from diffusing for example, into the overlying second epitaxial layer(s) 316, which serves as a channel region for a subsequently formed multi-gate device. In some embodiments, the oxidized layer 510 is referred as isolation region 510. In other embodiments, the isolation region 510 is omitted.

Figure 6:
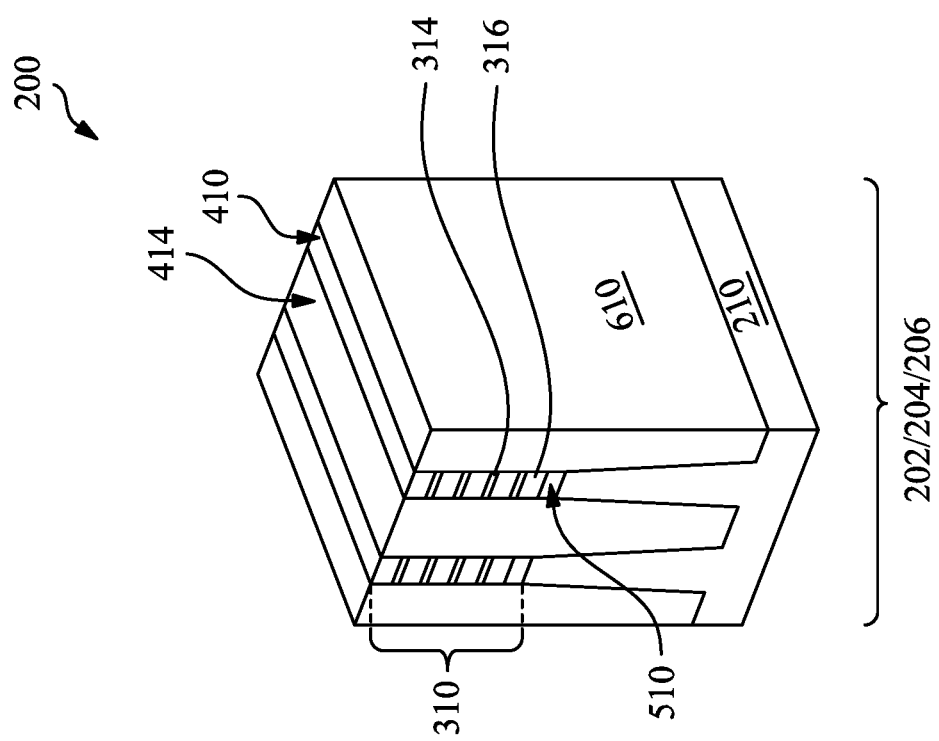

Referring to FIGS. 1 and 6, method 100 proceeds to step 110 by forming shallow trench isolation (STI) features 610 between the fins 410 (in the first, second and third regions, 202, 204 and 206). By way of example, in some embodiments, a dielectric layer is first deposited over the substrate 210, filling the trenches 414 with the dielectric material. In some embodiments, the dielectric layer may include SiO$_2$, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 610) may include a multi-layer structure, for example, having one or more liner layers.

In forming the STI features 610, after deposition of the dielectric layer, the deposited dielectric material is thinned and planarized, for example by a chemical mechanical polishing (CMP) process. The CMP process may planarize the top surface of the dielectric layer. In some embodiments, the CMP process used to planarize the top surface of the device 200 may also serve to remove the HM layer 320 from each of the plurality of fins 410. In some embodiments, removal of the HM layer 320 may alternately be performed by using a suitable etching process (e.g., dry or wet etching).

Figure 7:
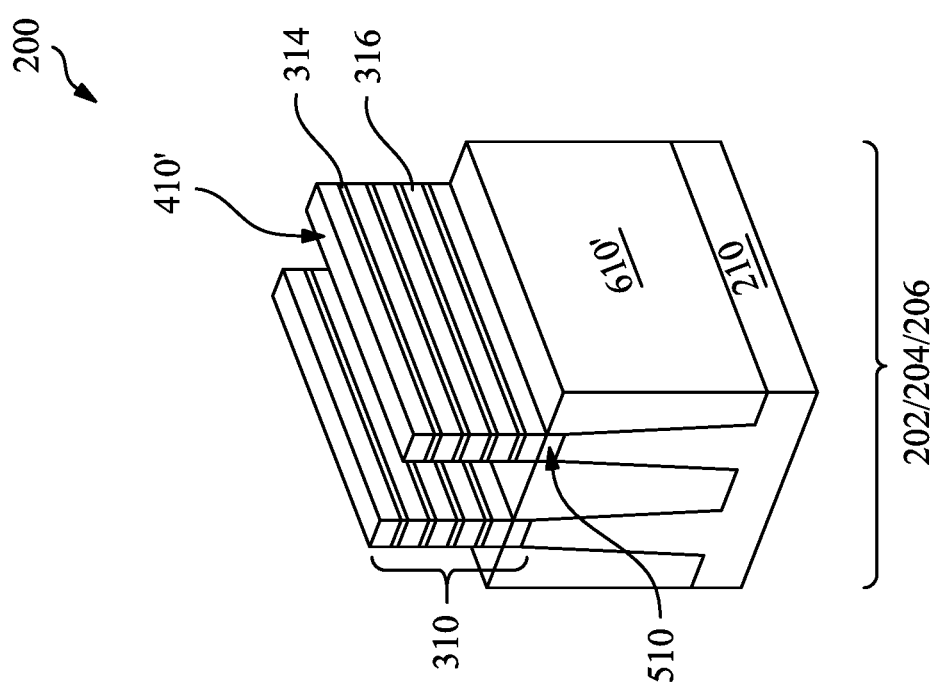

Referring to FIGS. 1 and 7, method 100 proceeds to step 112 by recessing the STI features 610, referred to as 610', interposing the fins 410 to provide the fins 410 extending above the recessed STI features 610' (in the first, second and third regions, 202, 204 and 206). In some embodiments, the recessing process may include a dry etching process, a wet etching process, and/or a combination thereof. In some embodiments, a recessing depth is controlled (e.g., by controlling an etching time) so as to result in a desired height of the exposed upper portion of the fins 410, referred to as 410'. The height 'H' exposes each of the layers of the epitaxy stack 310. While FIG. 7 illustrates the recess of the recessed STI feature 610' being substantially coplanar with a top surface of the isolation region 510, in other embodiment recessed STI feature 610' may not be substantially coplanar with the top surface of the isolation region 510.

Figure 8:
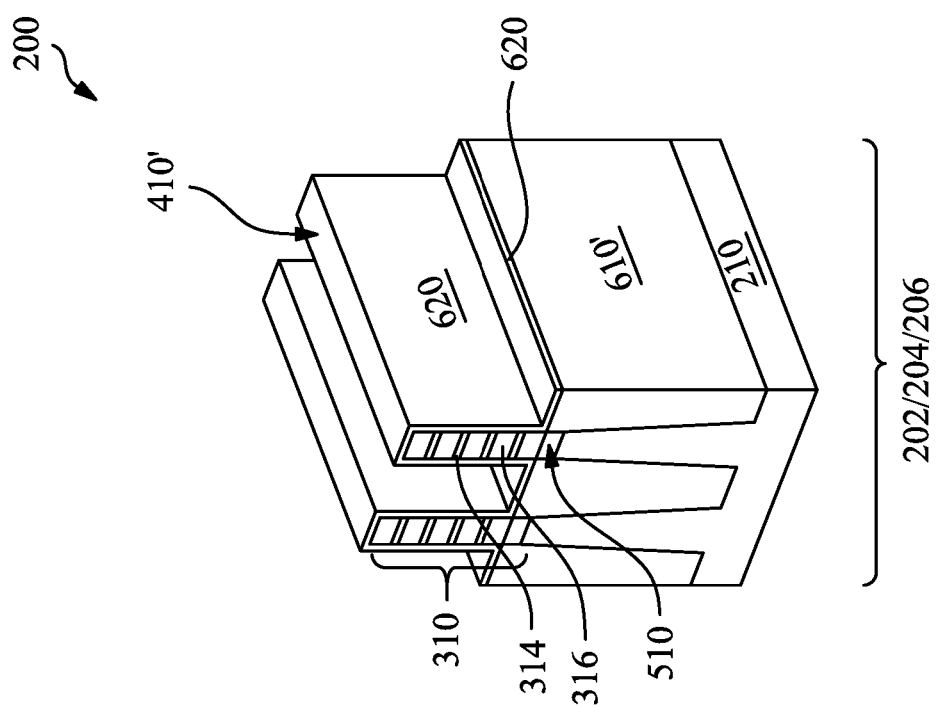

Referring to FIGS. 1 and 8, method 100 proceeds to step 114 by forming a dummy dielectric layer 620 over the fins 410' (in the first, second and third regions, 202, 204 and 206). In some embodiments, the dummy dielectric layer 620 may include SiO$_2$, silicon nitride, a high-K dielectric material and/or other suitable material. In various examples, the dummy dielectric layer 620 may be deposited by a CVD process, a subatmospheric CVD (SACVD) process, a flowable CVD process, an ALD process, a PVD process, or other suitable process. By way of example, the dummy dielectric layer 620 may be used to prevent damage to the fins 410' by subsequent processing (e.g., subsequent formation of the dummy gate stack).

Figure 9:
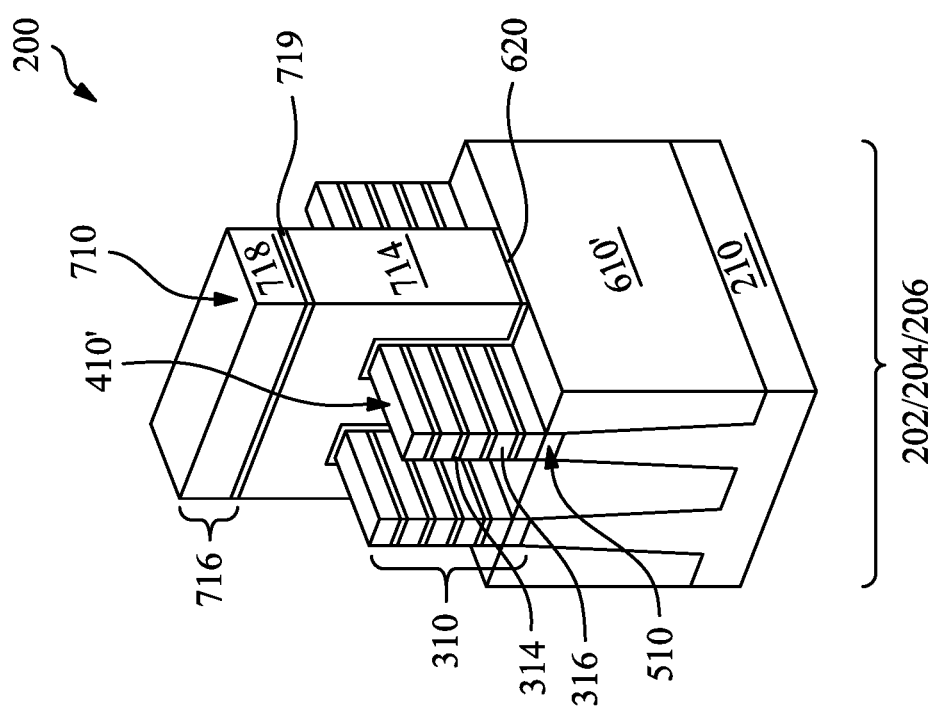

Referring to FIGS. 1 and 9, method 100 proceeds to step 116 by forming a gate stack 710 (in the first, second and third regions, 202, 204 and 206). In an embodiment, the gate stack 710 is a dummy (sacrificial) gate stack and will be replaced by the final gate stack at a subsequent processing stage of the device 200. In particular, the dummy gate stack 710 may be replaced at a later processing stage by a high-K dielectric layer (HK) and metal gate electrode (MG) as discussed below. In some embodiments, the dummy gate stack 710 is formed over the substrate 210 and is at least partially disposed over the fins 410'. The portion of the fins 410' underlying the dummy gate stack 710 may be referred to as a channel region. The dummy gate stack 710 may also define a source/drain region of the fins 410', for example, the regions of the fin 410' adjacent and on opposing sides of the channel region.

In some embodiments, the dummy gate stack 710 includes the dummy dielectric layer 620, an electrode layer 714, and a hard mask 716 which may include multiple layers 718 and 719 (e.g., an oxide layer 718 and a nitride layer 719). In some embodiments, the dummy dielectric layer 620 is not included in the dummy gate stack 710, for example, being removed prior to the deposition of the dummy gate stack 710. In some embodiments, an additional dummy gate dielectric layer is included in the gate stack in addition or in lieu of dummy dielectric layer 620. In some embodiments, the dummy gate stack 710 is formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

As indicated above, the dummy gate stack 710 may include an additional gate dielectric layer. For example, the dummy gate stack 710 may include silicon oxide. Alternatively or additionally, the gate dielectric layer of the dummy gate stack 710 may include silicon nitride, a high-K dielectric material or other suitable material. In some embodiments, the electrode layer 714 may include polycrystalline silicon (polysilicon). In some embodiments, the hard mask 716 includes an oxide layer 718 such as a pad oxide layer that may include $SiO_2$. In some embodiments, hard mask 716 includes the nitride layer 719 such as a pad nitride layer that may include $Si_3N_4$, silicon oxynitride and/or silicon carbide.

Referring again to FIG. 9, in some embodiments, after formation of the dummy gate 710, the dummy dielectric layer 620 is removed from the exposed regions of the substrate including fins 410' not covered by the dummy gate 710. The etch process may include a wet etch, a dry etch, and/or a combination thereof. In the present embodiment, the etch process is chosen to selectively etch the dummy dielectric layer 620 without substantially etching the fin 410', the hard mask 716 and the dummy gate stack 710.

Figure 10:
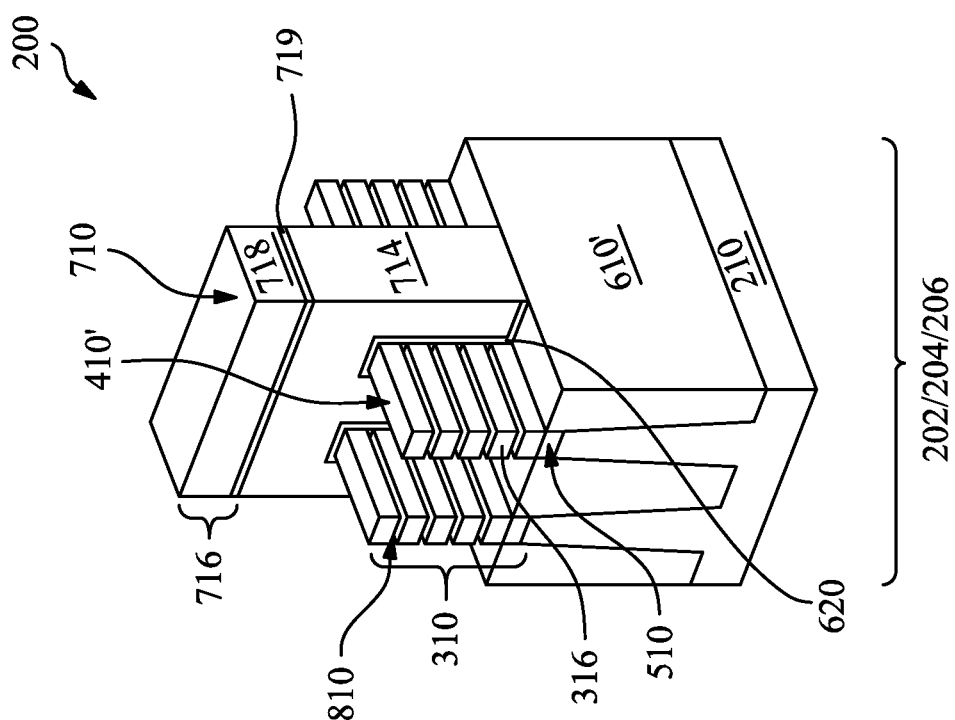

Referring to FIGS. 1 and 10, method 100 proceeds to step 118 by removing the first epitaxial layers 314 from a source/drain region of the fins 410' (e.g., the region of the fin adjacent the channel region underlying the gate stack) (in the first, second and third regions, 202, 204 and 206). FIG. 10 illustrates gaps 810 in the place of the epitaxial layers 314 (FIG. 9). The gaps 810 may be filled with the ambient environment (e.g., air, $N_2$). In an embodiment, the first epitaxial layers 314 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$. In an embodiment, the first epitaxial layers 314 are SiGe and the second epitaxial layers 316 are silicon allowing for the selective removal of the first epitaxial layers 314.

Figure 11B:
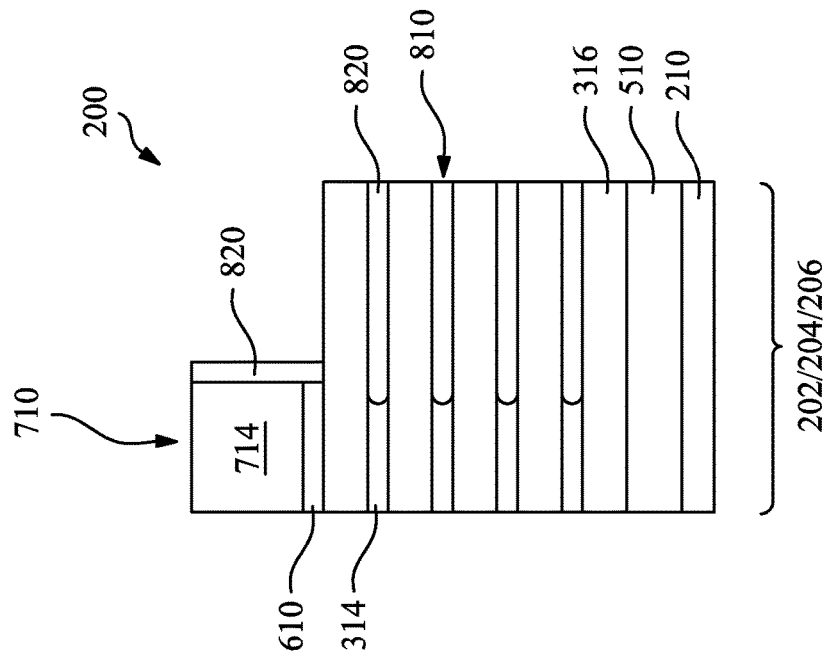
FIG. 11B is a cross-section views, corresponding to the isometric view of FIG. 11A along line A-A, of an embodiment of the device 200 according to aspects of the method of FIG. 1.
Figure 11A:
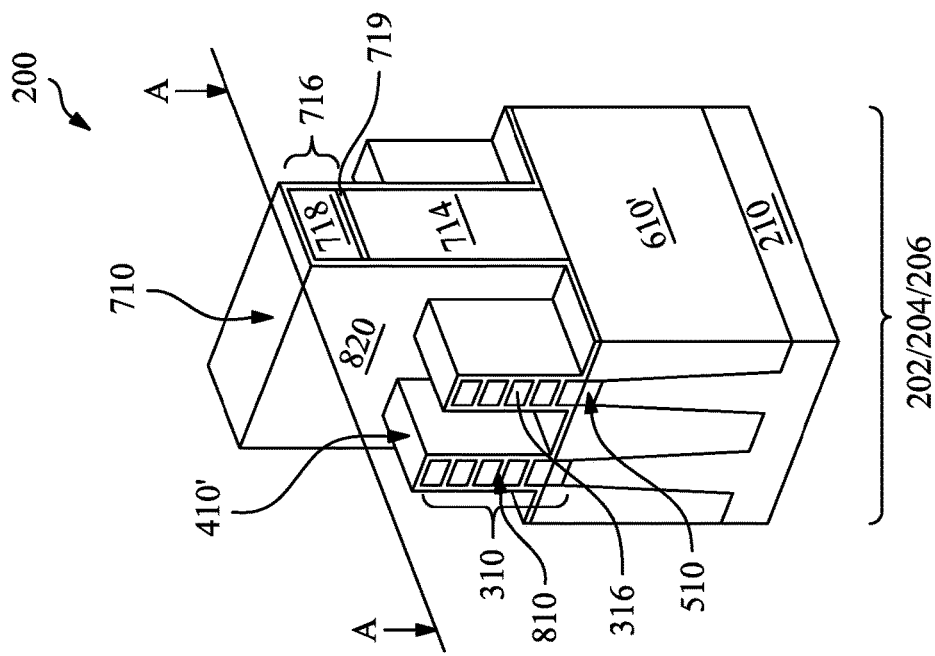

Referring to FIGS. 1, 11A and 11B, method 100 proceeds to step 120 by forming a spacer layer 820 over the substrate 210 (including over the first, second and third regions, 202, 204 and 206). The spacer layer 820 may be a conformal dielectric layer formed over the substrate 210. The spacer layer 820 may form spacer elements on the sidewalls of the dummy gate stack 710. The spacer layer 820 may also fill the gaps 810 provided by the removal of the epitaxial layers described in step 118 above. Referring to FIG. 11A, the spacer layer 820 is disposed over the substrate 210 including filling the gaps (gaps 810 of FIG. 10) between second epitaxial layers 316 in the source/drain region of the fins 410'. FIG. 11B illustrates the partial cross-section corresponding to FIG. 11A along line A-A.

The spacer layer 820 may include a dielectric material such as silicon oxide, silicon nitride, silicon carbide, silicon oxynitride, SiCN films, silicon oxycarbide, SiOCN films, and/or combinations thereof. In some embodiments, the spacer layer 820 includes multiple layers, such as main spacer walls, liner layers, and the like. By way of example, the spacer layer 820 may be formed by depositing a dielectric material over the dummy gate stack 710 using processes such as, CVD process, a subatmospheric CVD (SACVD) process, a flowable CVD process, an ALD process, a PVD process, or other suitable process. In certain embodiments, the deposition may be followed by an etching back (e.g., anisotropically) the dielectric material.

Figure 12:
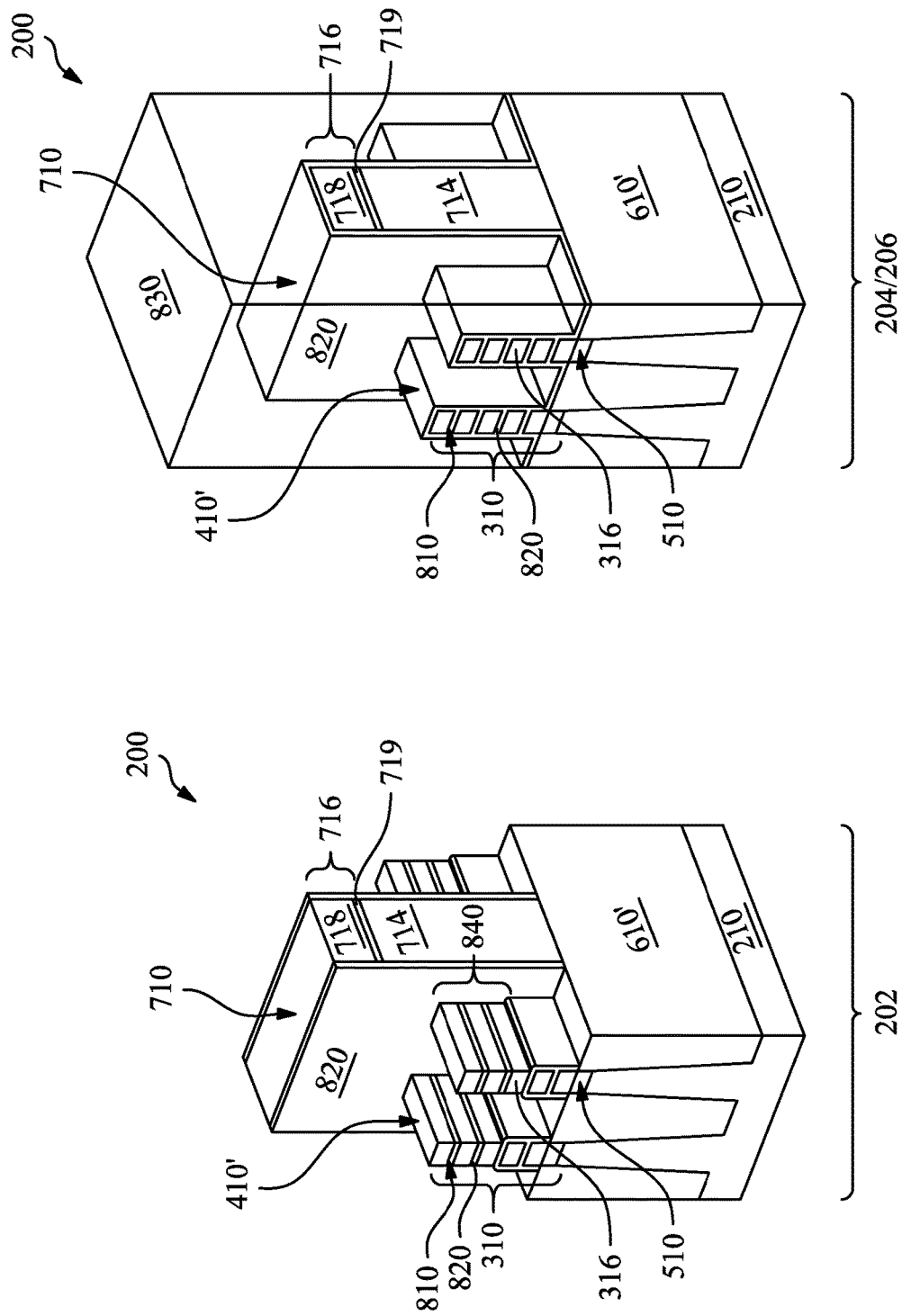
FIGS. 12, 13A, 13B, 14, 15, 16A, 16B, 17A, 17B, 18A, 18B, 19A, 19B and 19C are isometric views of an embodiment of a device 200 according to aspects of the method of FIG. 1.

Referring to FIGS. 1 and 12, method 100 proceeds to step 122 by etching-back the spacer layer 820 in the first region 202, while leaving the spacer layer 820 intact in the second region 204 and the third region 206. In some embodiments, prior to etching back the spacer layer 820 in the first region 202, a first patterned HM 830 is formed to cover the second region 204 and the third region 206. In some embodiments, the first patterned HM 830 may include a patterned photoresist layer and formed by a by a lithography process. Alternatively, the first patterned HM 830 may be formed by depositing a HM layer, forming a patterned photoresist layer over the HM layer by a lithography process and etching the HM material layer through the patterned photoresist layer to form the first patterned HM 830.

In the present embodiment, the spacer layer 820 is etched back to expose portions of the fins 410' adjacent to and not covered by the gate structure 710 (e.g., source/drain regions). The spacer layer 820 may remain on the sidewalls of the dummy gate structure 710 forming spacer elements. In some embodiments, etching-back of the spacer layer 820 may include a wet etch process, a dry etch process, a multiple-step etch process, and/or a combination thereof. While the spacer layer 820 being removed from a top surface and the lateral surfaces of the exposed epitaxial stack 310, as illustrated in FIG. 12, the spacer layer 820 remains interposing the second epitaxial layer 316 of the epitaxial stack 310 in the source/drain region.

In the present embodiment, the etching-back of the spacer layer 820 in the first region 202 is controlled (e.g. etch time) to expose a first designated portion 840 (an upper portion) of the epitaxial stack 310 in the source/drain regions and cover a lower portion of the epitaxial stack 310 with the spacer layer 820. It is noted that three (3) second epitaxial layers 316 in the first designated portion 840 are illustrated in FIG. 12, this is for illustrative purposes only and not intended to be limiting. It can be appreciated that any number of first epitaxial layers 316 can be exposed in the first designated portion 840, the number of layers depending on the desired number of source/drain regions for the device 200.

After etching back the spacer layer 820 in the first region 202, the first patterned HM 830 is removed by an etch process. In one example where the first patterned HM 830 is a photoresist pattern, the first patterned HM 830 is removed by wet stripping and/or plasma ashing.

Figure 13A:
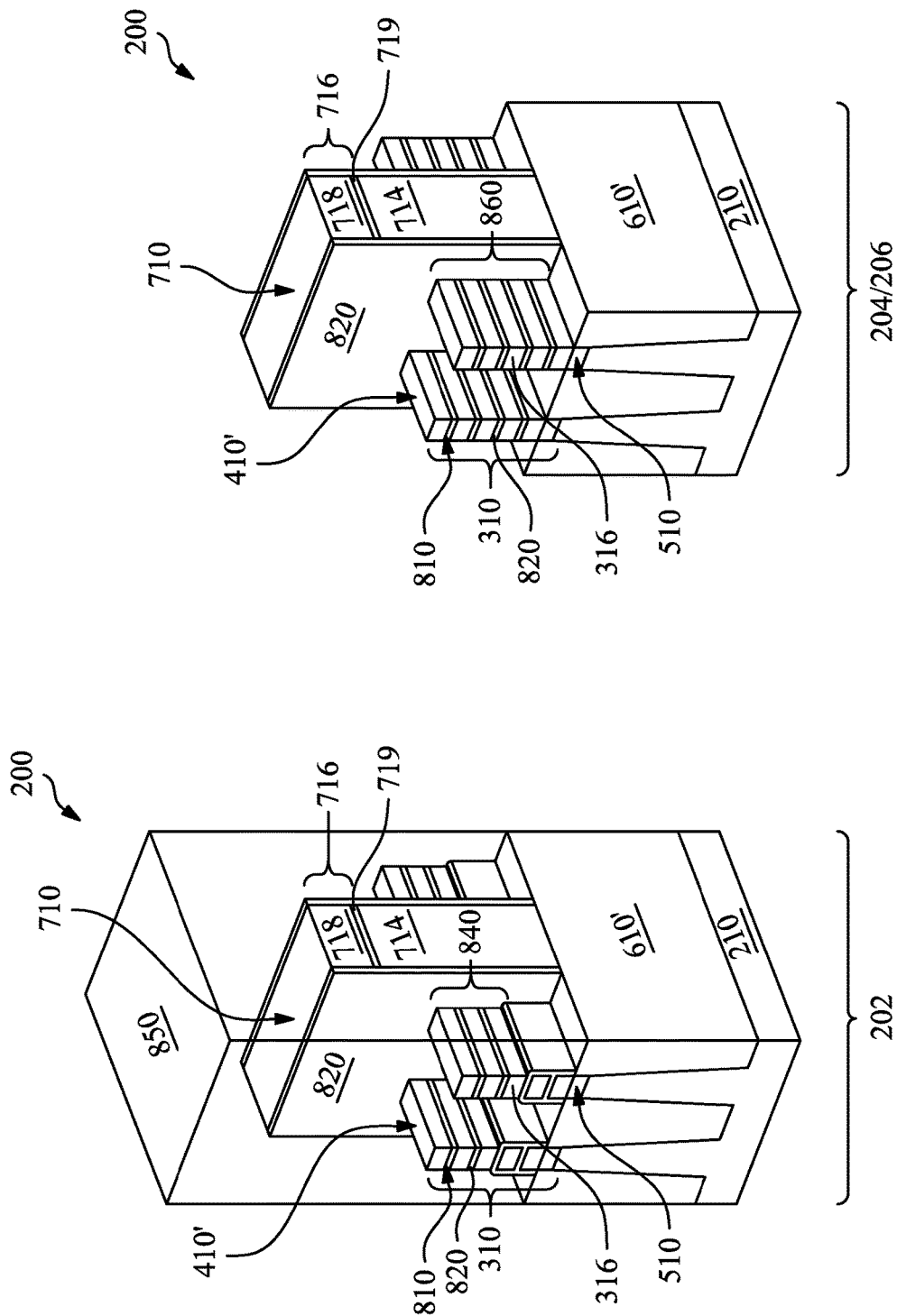

Referring to FIGS. 1 and 13A, method 100 proceeds to step 124 by etching-back the spacer layer 820 in the second region 204 and the third region 206 while covering the first region 202 with a second patterned HM 850. The second patterned HM 850 is forming similarly in many respects to the first patterned HM 830 discussed above association with FIG. 12, including the materials discussed therein. The etching-back process is similar in many respects to the etching-back process discussed above association with FIG. 12. In the present embodiment, the etching-back of the spacer layer 820 in the second region 204 and third region 206 is controlled to expose a second designated portion 860 of the epitaxial stack 310 in the S/D regions. The second designated portion 860 has different number of nanowires 316 than the first designated portion 840. In an embodiment, the second designated portion 860 includes five nanowires 316 (five second epitaxial layers 316).

Figure 13B:
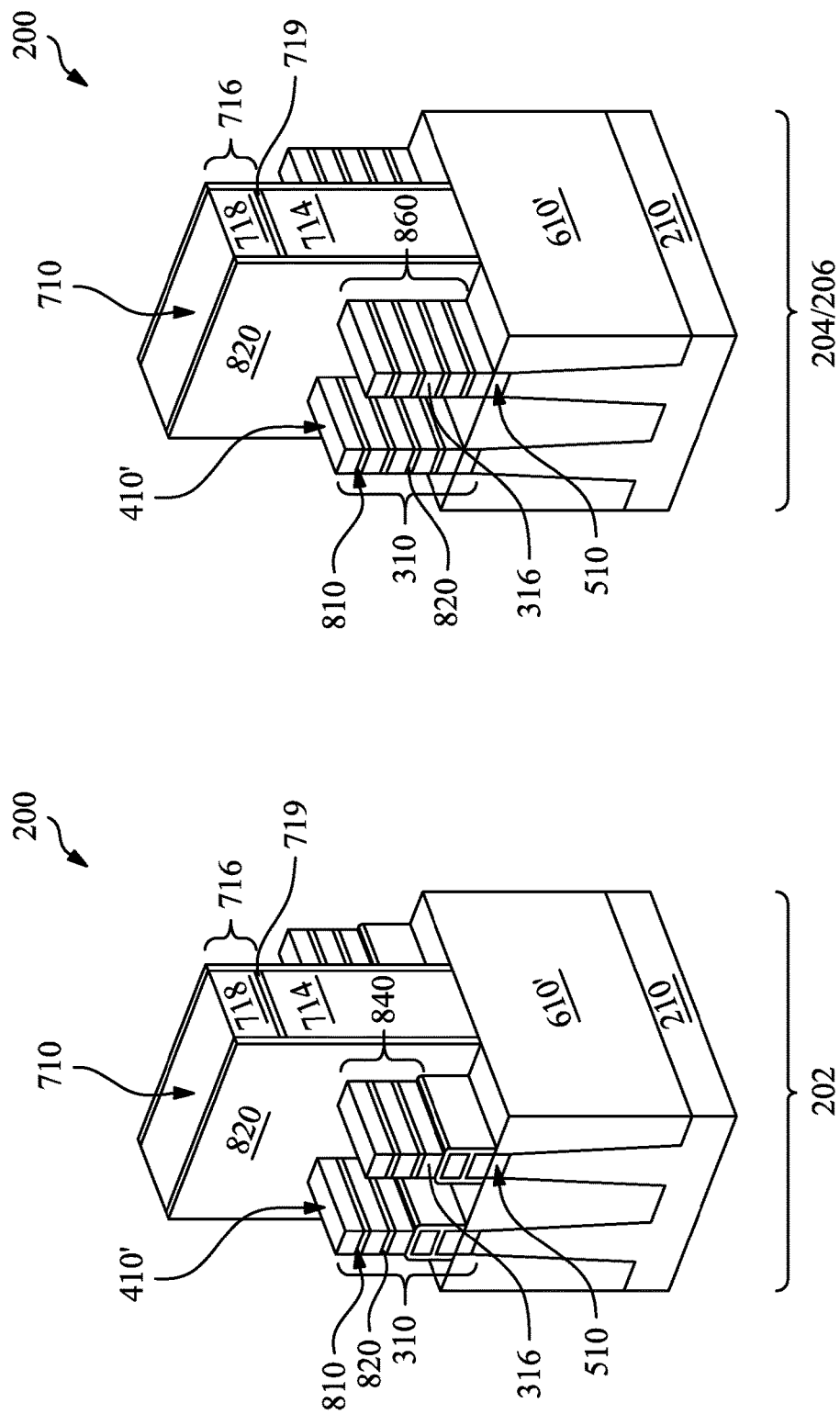

After etching back the spacer layer 820 in the second region 204, the second patterned HM 850 is removed by an etch process, as shown in FIG. 13B. In one example where the second patterned HM 850 is a photoresist pattern, the second patterned HM 850 is removed by wet stripping and/or plasma ashing.

Figure 14:
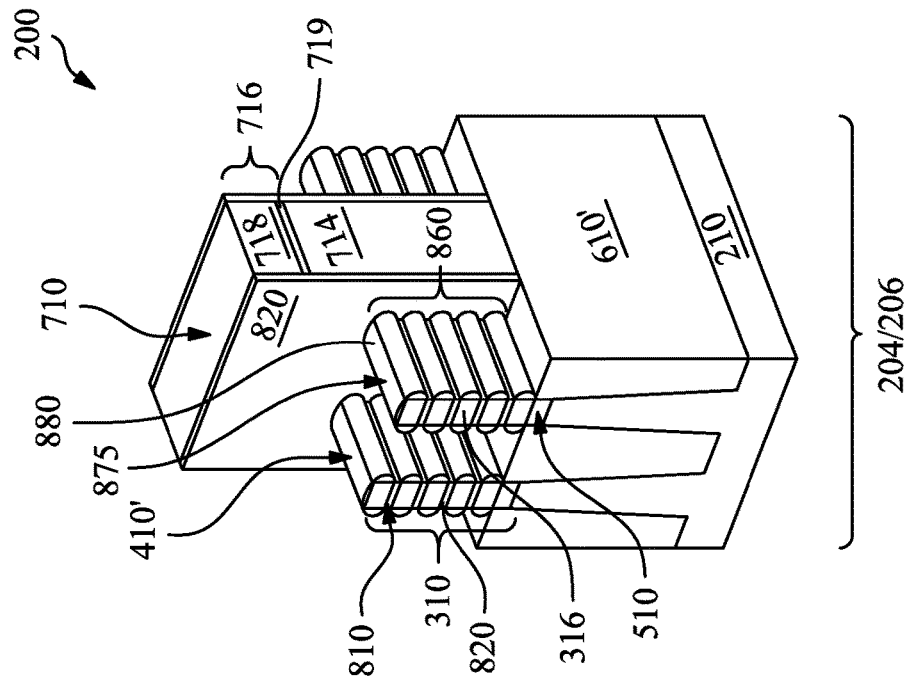
Figure 14:
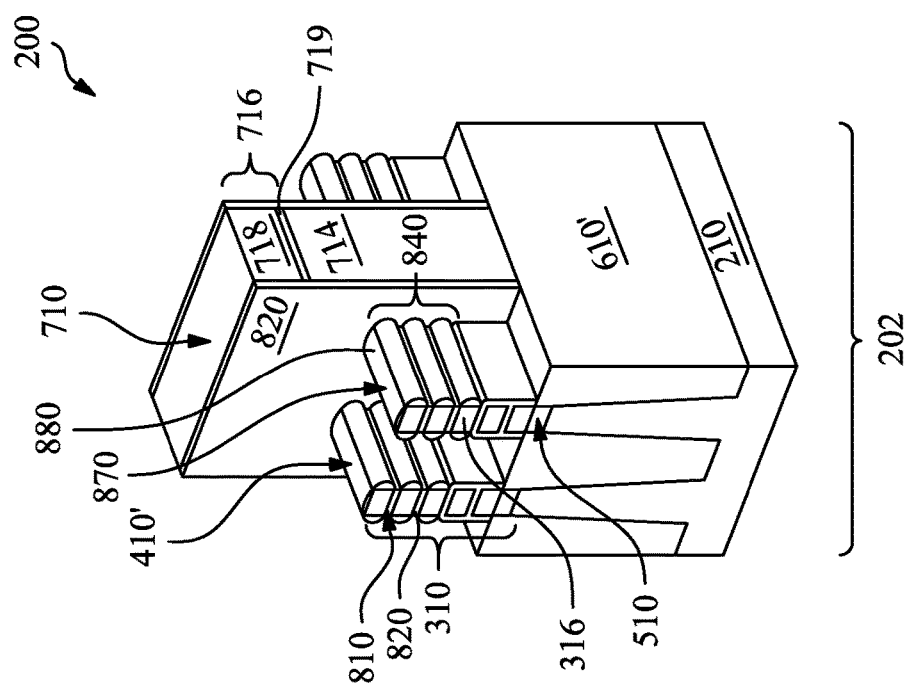

Referring to FIGS. 1 and 14, method 100 proceeds to step 126 by forming a first S/D feature 870 in the first region 202 and a second S/D feature 875 in the second region 204 and third region 206. The first and second S/D features, 870 and 875, may be formed by performing an epitaxial growth process that provides an epitaxy material cladding the first and second designated portions, 840 and 860, of the epitaxial stack 310. In some embodiments, the first and second S/D features, 870 and 875, are formed by epitaxially growing a semiconductor material 880 on the second epitaxial layer 316 in the first and second designated portions, 840 and 860, respectively. In other words, the epitaxially grown semiconductor material 880 is formed around nanowires 316, this may be referred to as forming a "cladding" around the nanowire.

In various embodiments, the epitaxially grown semiconductor material 880 may include Ge, Si, GaAs, AlGaAs, SiGe, GaAsP, SiP, or other suitable material. In some embodiments, the epitaxially grown semiconductor material 880 may be in-situ doped during the epi process. For example, in some embodiments, the epitaxially grown semiconductor material 880 may be doped with boron. In some embodiments, the epitaxially grown semiconductor material 880 may be doped with carbon to form Si:C source/drain (S/D) features, phosphorous to form Si:P S/D features, or both carbon and phosphorous to form SiCP S/D features. In an embodiment, the second epitaxial layer 316 is silicon and the epitaxially grown semiconductor material 880 also is silicon. In some embodiments, the second epitaxial layer 316 and epitaxially grown semiconductor material 880 may comprise a similar material, but be differently doped. In other embodiments, the second epitaxy layer 316 includes a first semiconductor material, the epitaxially grown semiconductor material 880 includes a second semiconductor different than the first semiconductor material.

In some embodiments, the epitaxially grown semiconductor material 880 is not in-situ doped, and, for example, instead an implantation process is performed to dope the epitaxially grown semiconductor material 880. As described above, the isolation region 510 which remains present beneath the gate stack 710 blocks potential unwanted diffusion of the implanted dopants.

Thus, the first and second S/D features, 870 and 875, associated with the dummy gate stack 710 include the second epitaxy material 316 and/or the epitaxially grown material 880. Dielectric material from the spacer layer 820 interposes the second epitaxy layer 316. Each of the epitaxial material 316 (e.g., nanowires) extends into the channel region, thereby forming a multi-channel, multi-S/D region device. In an embodiment, in the first region 202, the first S/D feature 870 formed over three nanowires extends into the channel region while in the second region 204 and third region 206, the second S/D feature 875 formed over the five nanowires extends into the channel region.

Figure 15:
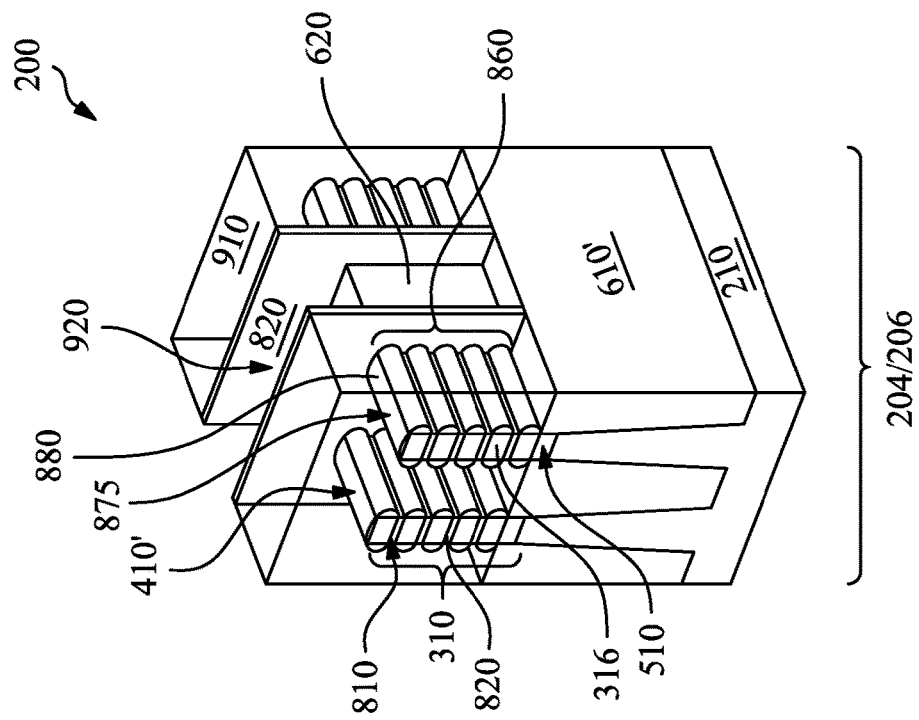
Figure 15:
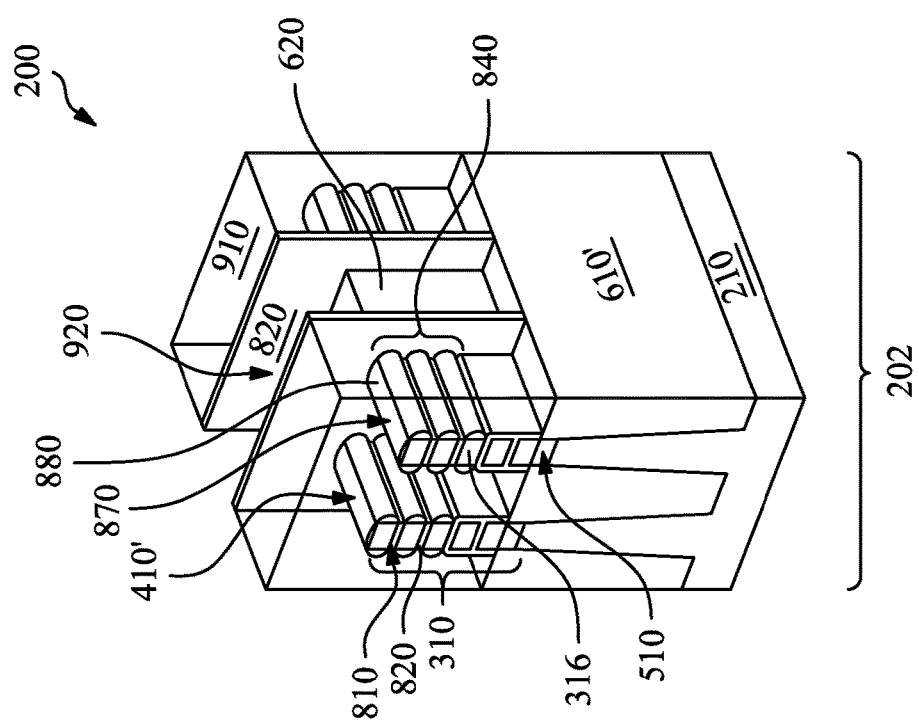

Referring to FIGS. 1 and 15, method 100 proceeds to step 128 by forming an inter-layer dielectric (ILD) layer 910 over the substrate 210, including the first region 202, the second region 204 and the third region 206. In certain embodiments, after forming the ILD layer 910, the dummy gate stack 710 is removed (as discussed below). In some embodiments, the ILD layer 910 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 910 may be deposited by a PECVD process or other suitable deposition technique. In some embodiments, after formation of the ILD layer 910, the semiconductor device 200 may be subject to a high thermal budget process to anneal the ILD layer. As described above, the isolation region 510 can block some potential diffusion of APT dopants from within the substrate regions into the device channel region during such high thermal budget processing.

In some examples, after depositing the ILD layer 910, a planarization process may be performed to expose a top surface of the dummy gate stack 710. For example, a planarization process includes a chemical mechanical planarization (CMP) process which removes portions of the ILD layer 910 overlying the dummy gate stack 710 and planarizes a top surface of the semiconductor device 200. In addition, the CMP process may remove the hard mask 716 overlying the dummy gate stack 710 to expose the electrode layer 714, such as a polysilicon electrode layer. Thereafter, in some embodiments, the remaining previously formed dummy gate stack 710 is removed from the substrate 210. In some embodiments, the electrode layer 714 may be removed while the dummy dielectric layer 620 is not removed. The removal of the electrode layer 714 from the dummy gate stack 710 results in a gate trench 920 illustrated in FIG. 15.

A final gate structure (e.g., including a high-K dielectric layer and metal gate electrode) may be subsequently formed in the gate trench 920, as described below. The removal of the dummy gate stack features may be performed using a selective etch process such as a selective wet etch, a selective dry etch, or a combination thereof.

Figure 16A:
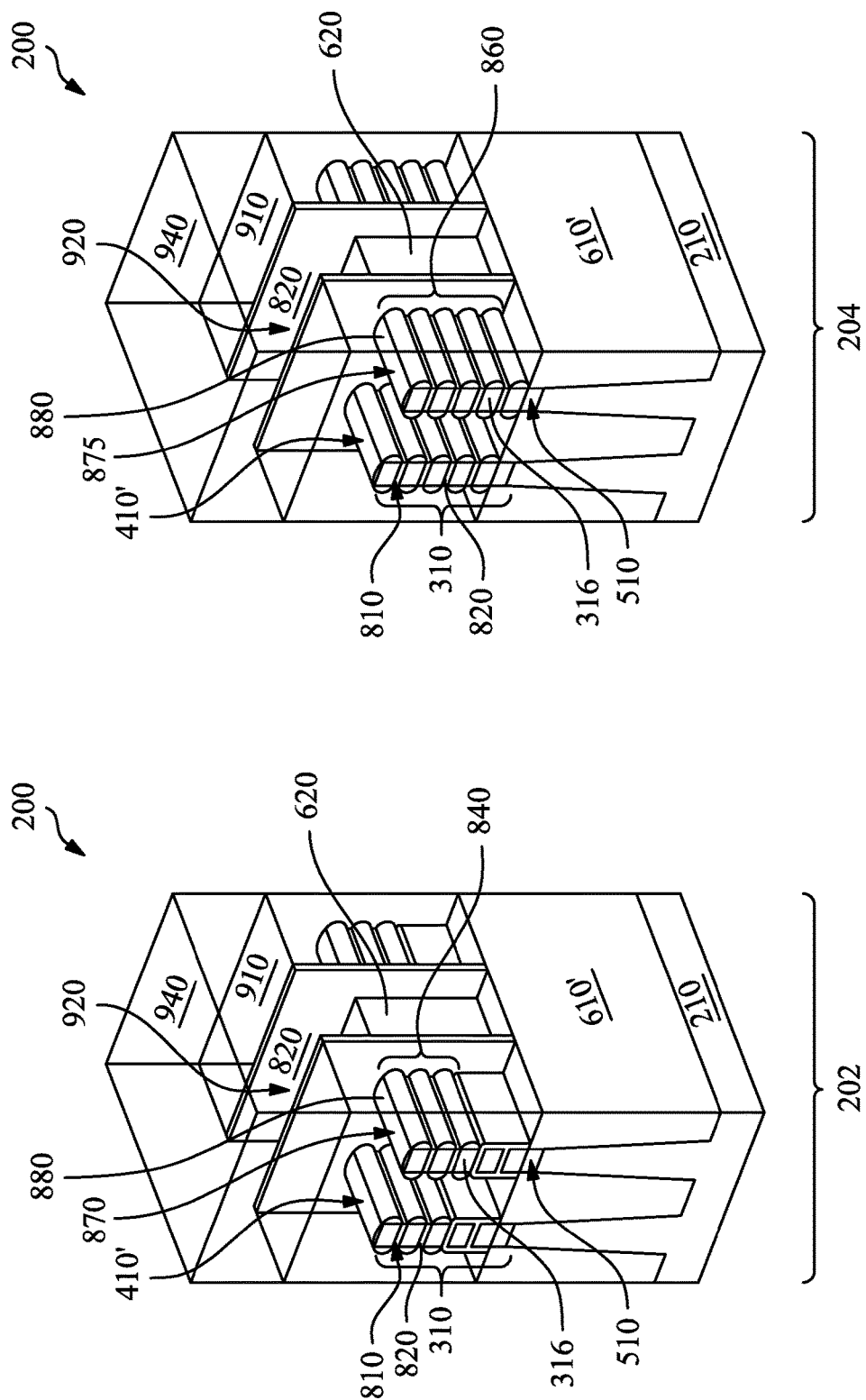
Figure 16B:
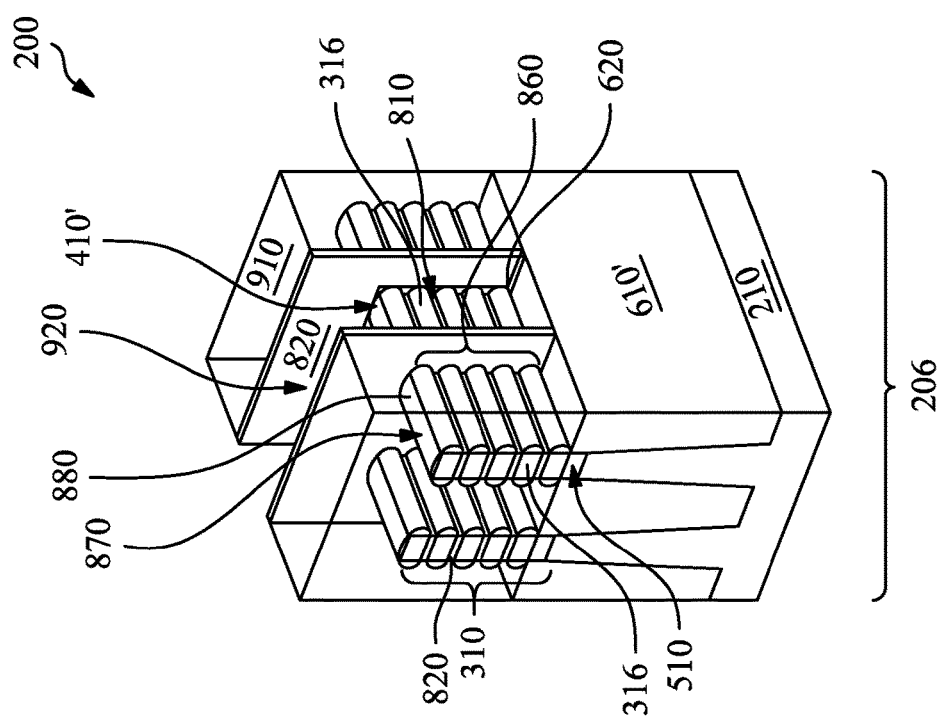

Referring to FIGS. 16A and 16B, method 100 proceeds to step 130 by removing the dummy dielectric layer 620 and the first epitaxial layer 314 in the gate trench 920 in the third region 206 over the substrate 210, where an input/output (I/O) feature will be formed later. Prior to removing the dummy dielectric layer 620 and the first epitaxial layers 314 in the third region 206, a third patterned HM 940 is formed to cover the first region 202 and the second region 204. The third patterned HM 940 is formed similarly in many respects to the first patterned HM 830 discussed above association with FIG. 12, including the materials discussed therein.

The dummy dielectric layer 620 is removed similarly in many respects to the etching process discussed above association with FIG. 9. The first epitaxial layer 314 is removed similarly in many respects to the etching process discussed above association with FIG. 10. FIG. 16B illustrates gaps 810 in the place of the first epitaxial layers 314. The gaps 810 may be filled with the ambient environment (e.g., air, $N_2$).

The third patterned HM 940 is then removed by an etch process. In one example where the third patterned HM 940 is a photoresist pattern, the third patterned HM 940 is removed by wet stripping and/or plasma ashing.

Figure 17A:
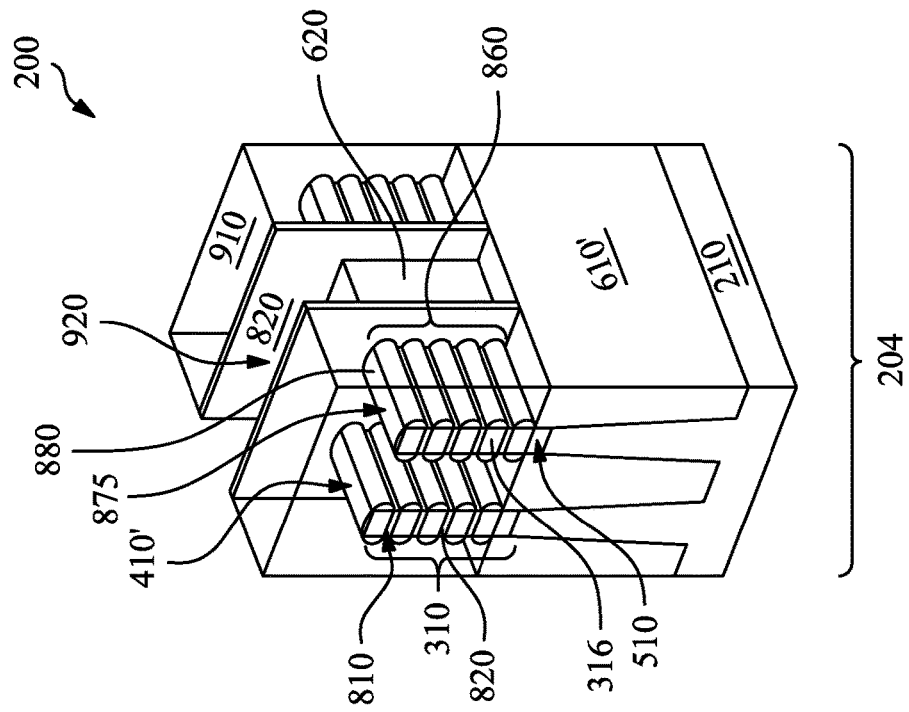
Figure 17A:
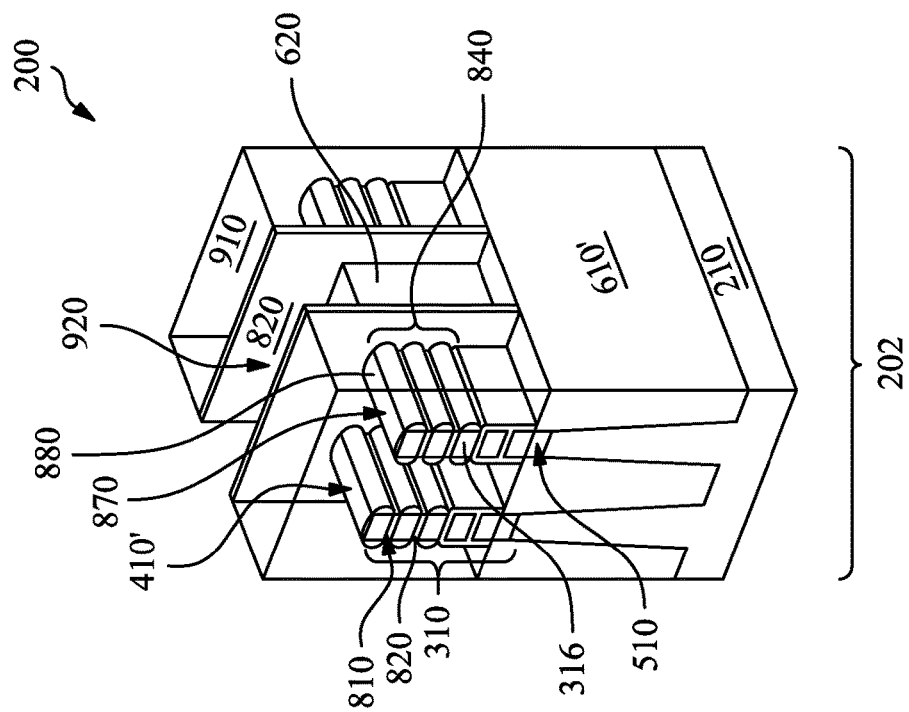
Figure 17B:
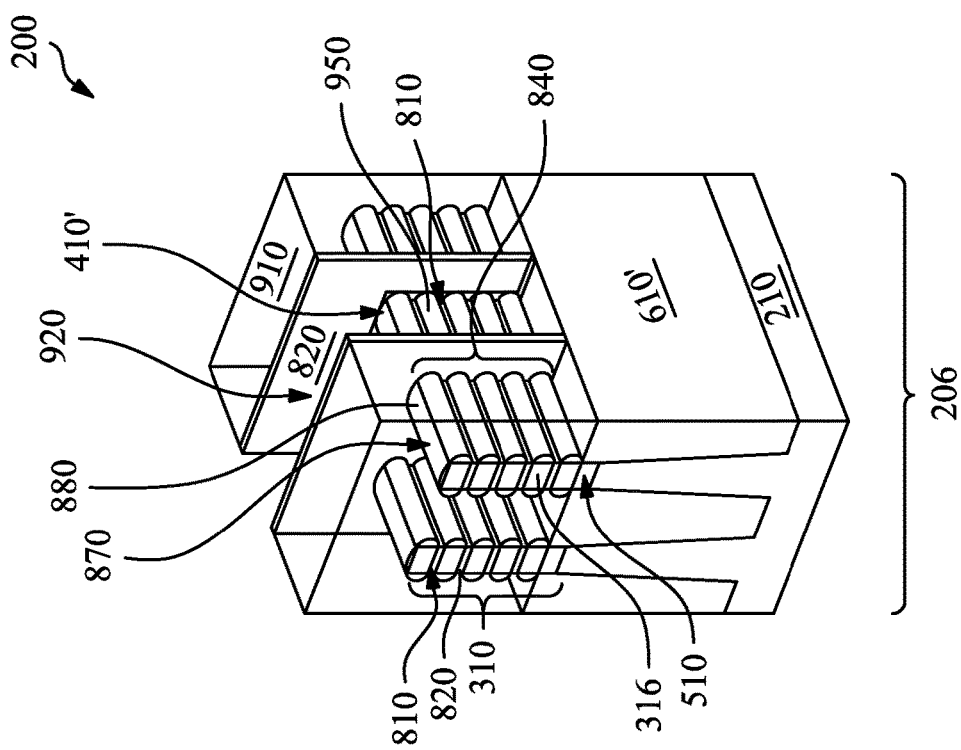

Referring to FIGS. 1, 17A and 17B, method 100 proceeds to step 132 by forming an I/O dielectric layer 950 over the second epitaxial layer 316 in the gate trench 920 in the third region 206. The I/O dielectric layer 950 includes silicon oxide, silicon nitride, silicon carbide, silicon oxynitride, and/or combinations thereof. The I/O dielectric layer 950 may also fill the gaps 810 provided by the removal of the first epitaxial layers 314 described in step 130 above. In some embodiments, the I/O dielectric layer 950 includes multiple layers. By way of example, the I/O dielectric layer 950 may be formed by depositing a dielectric material over the dummy gate stack 710 using processes such as, CVD process, a sub-atmospheric CVD (SACVD) process, a flowable CVD process, an ALD process, a PVD process, or other suitable process.

Figure 18A:
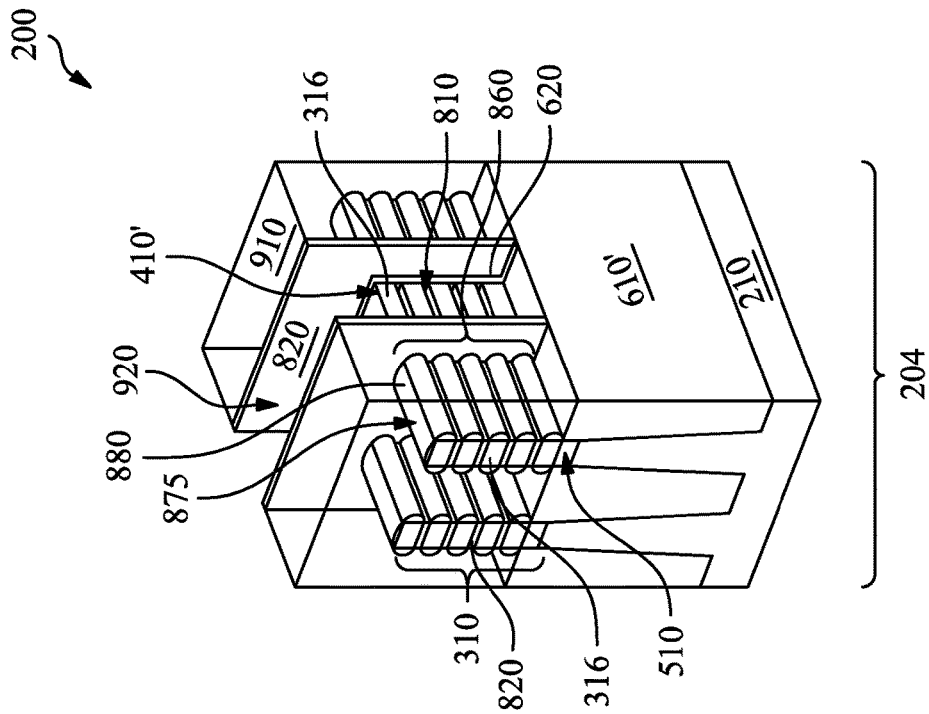
Figure 18A:
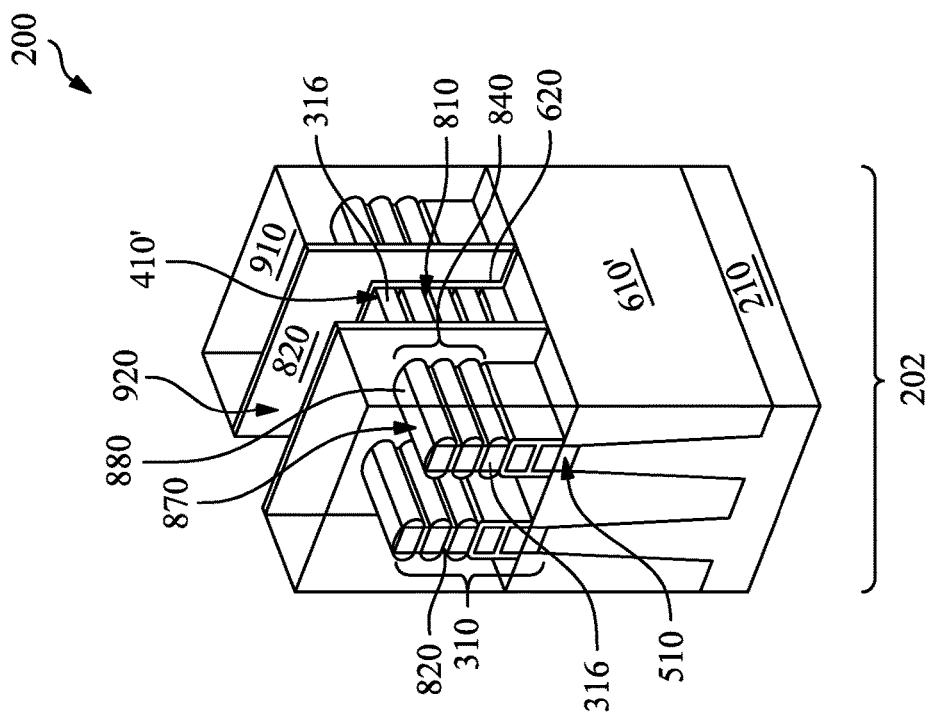
Figure 18B:
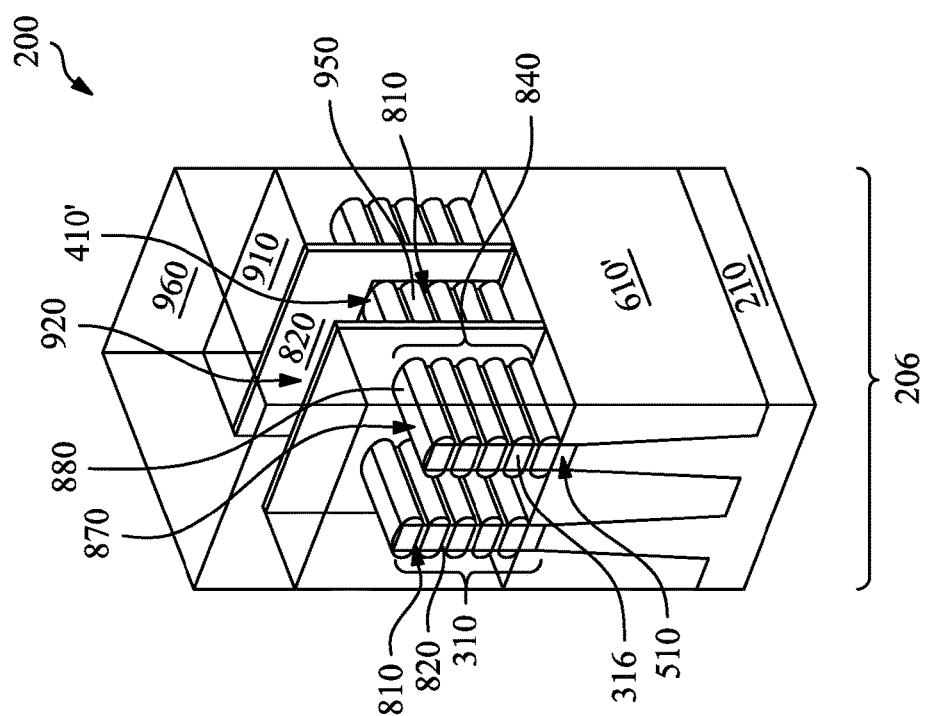
Figure 19A:
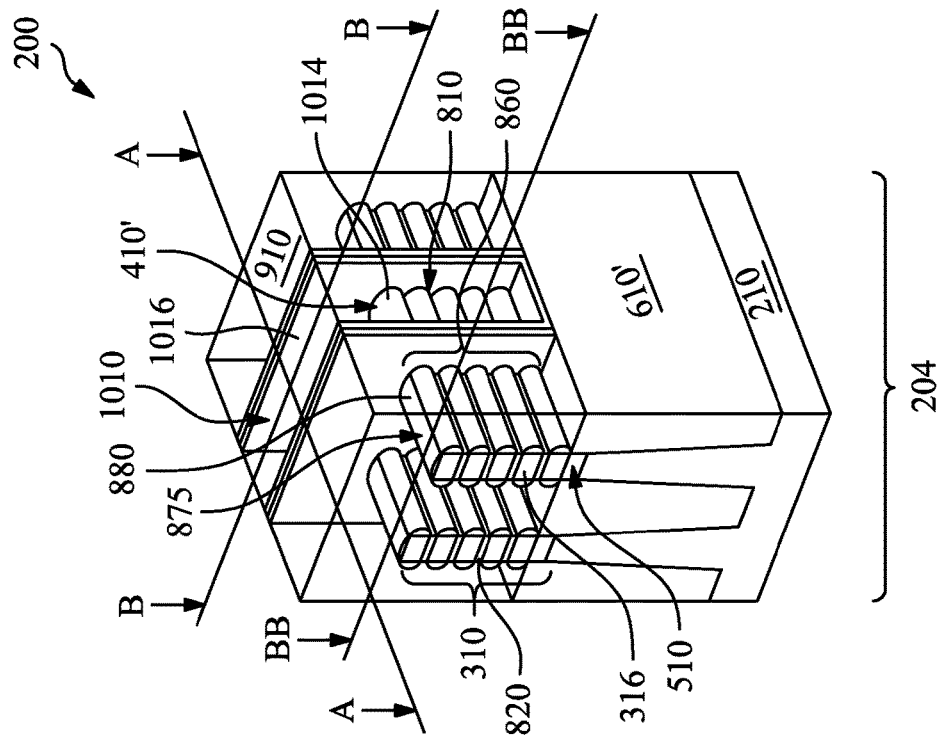
Figure 19B:
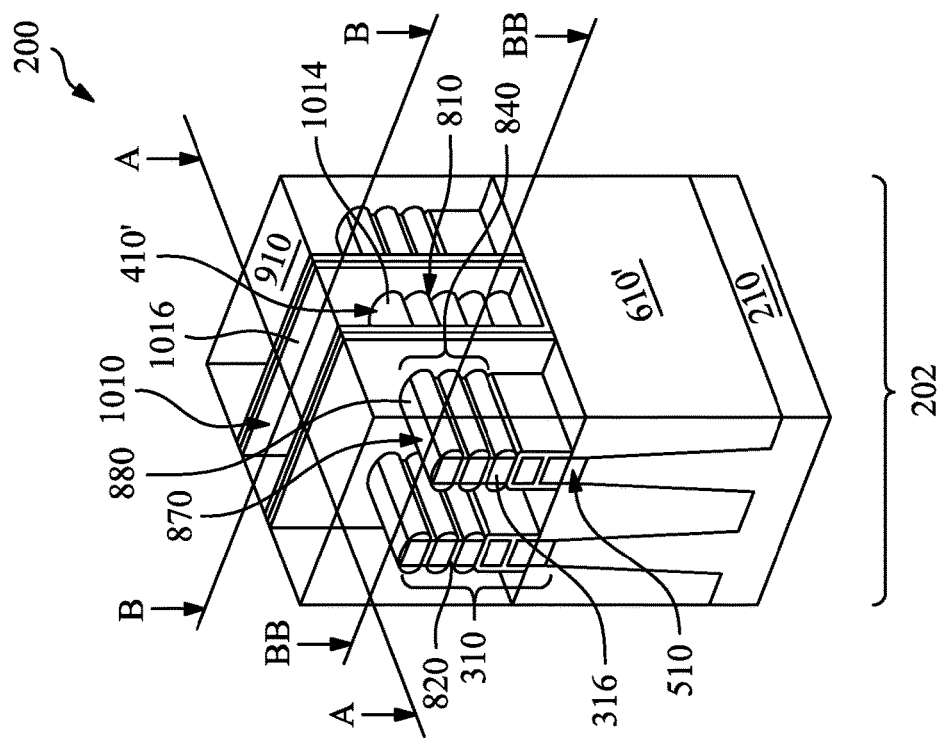
Figure 19C:
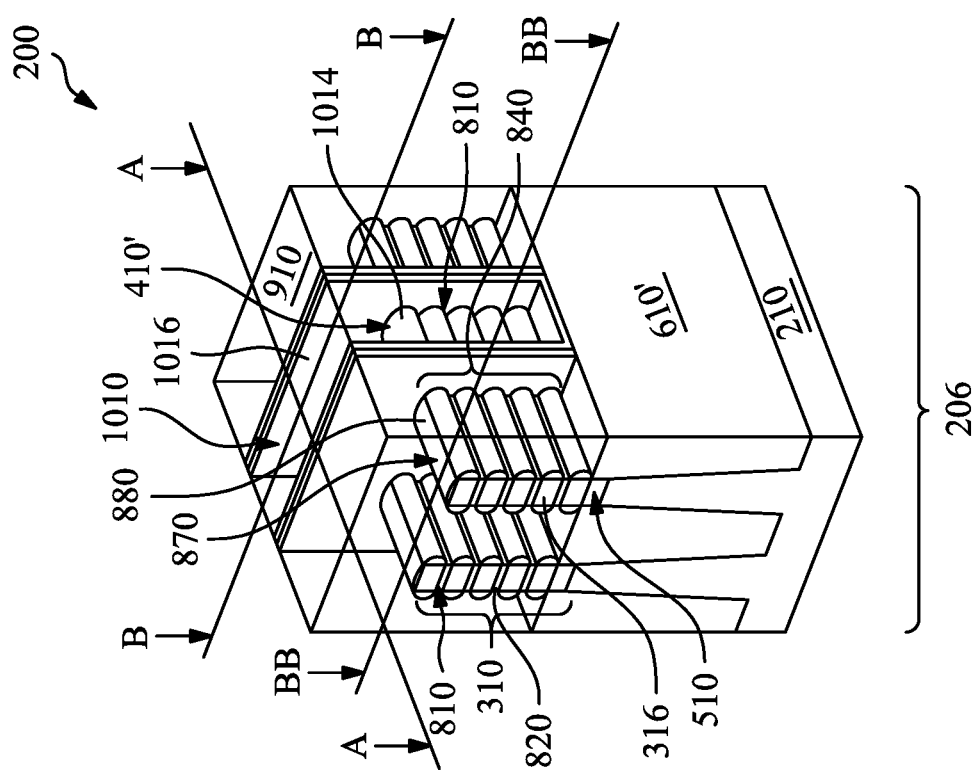

Referring to FIGS. 1, 18A and 18B, method 100 proceeds to step 134 by removing the dummy dielectric layer 620 and the first epitaxial layer 314 in the gate trenches 920 in the first and second regions, 202 and 204, where a channel region of a final gate structure will be formed. The third region 206 is covered by a fourth patterned HM 960 during this removal process. The fourth patterned HM 960 is formed similarly in many respects to the first patterned HM 830 discussed above association with FIG. 12, including the materials discussed therein. The dummy dielectric layer 620 is removed similarly in many respects to the etching process discussed above association with FIG. 9. The first epitaxial layer 314 is removed similarly in many respects to the etching process discussed above association with FIG. 10. FIG. 18A illustrates gaps 810 in the place of the first epitaxial layers 314.

After removing the dummy dielectric layer 620 and the first epitaxial layer 314 in the first and second regions, 202 and 204, the fourth patterned HM 960 is removed by an etch process. In one example where the fourth patterned HM 960 is a photoresist pattern, the fourth patterned HM 960 is removed by wet stripping and/or plasma ashing.

As a result, the second epitaxial layers 316 (nanowires) are exposed with in the gate trench 920 in the first and second regions, 202 and 204. It is noted that during the interim processing stage of step 134, gaps 810 are provided between the adjacent nanowires in the channel region (e.g., gaps 810 between epitaxy layers 316). The gaps 810 may be filled with the ambient environment conditions (e.g., air, nitrogen, etc).

It is also noted that as illustrated in the accompanying figures the second epitaxy layers 316 (e.g., nanowires) have a substantially rounded shape (e.g., cylindrical). The second epitaxy layers 316 (e.g., nanowires) have a substantially bar-shaped shape in the source drain region. In some embodiments, this difference in the shape of the second epitaxy layer 316 is due to the quantity and nature of the processing in each region. For example, in the channel region the dummy oxide removal and/or high-k dielectric deposition processes may provide for rounded shape. In some embodiments, the shape may be substantially similar in each region.

Referring to FIGS. 1,19A, 19B and 19C, method 100 proceeds to step 136 by forming final gate stacks 1010 within the gate trench 920 of the device 200. The final gate structure may be the gate of a multi-gate transistor. The final gate structure may be a high-K/metal gate stack, however other compositions are possible. In some embodiments, the final gate structure forms the gate associated with the multi-channels provided by the plurality of nanowires (now having gaps 810 there between) in the channel region. In the present embodiment, high-K/metal gate (HK/MG) stacks 1010 are formed within the gate trenches 920 of the device 200. In various embodiments, the HK/MG stack 1010 includes an interfacial layer, a high-K gate dielectric layer 1014 formed over the interfacial layer, and/or a metal layer 1016 formed over the high-K gate dielectric layer 1014. High-K gate dielectrics, as used and described herein, include dielectric materials having a high dielectric constant, for example, greater than that of thermal silicon oxide (~3.9). The metal layer 1016 used within high-K/metal gate stack 1010 may include a metal, metal alloy, or metal silicide. Additionally, the formation of the HK/MG stack 1010 may include depositions to form various gate materials, one or more liner layers, and one or more CMP processes to remove excessive gate materials and thereby planarize a top surface of the semiconductor device 200.

In some embodiments, the interfacial layer of the HK/MG stack 1010 may include a dielectric material such as silicon oxide ($SiO_2$), HfSiO, or silicon oxynitride (SiON). The interfacial layer may be formed by chemical oxidation, thermal oxidation, ALD, CVD, and/or other suitable method. The gate dielectric layer 1014 of the HK/MG stack 1010 may include a high-K dielectric layer such as hafnium oxide ($HfO_2$). Alternatively, the gate dielectric layer 1014 of the HK/MG stack 1010 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 1014 may be formed by ALD, PVD, CVD, oxidation, and/or other suitable methods.

The metal layer 1016 of the HK/MG stack 1010 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the metal layer 1016 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the metal layer 1016 may be formed by ALD, PVD, CVD, e-beam evaporation, or other suitable process. Further, the metal layer 1016 may be formed separately for N-FET and P-FET transistors which may use different metal layers. In various embodiments, a CMP process may be performed to remove excessive metal from the metal layer 1016 hereby provide a substantially planar top surface of the metal layer 1016.

In addition, the metal layer may provide an N-type or P-type work function, may serve as a transistor (e.g., FIN-FET) gate electrode, and in at least some embodiments, the metal layer 1016 may include a polysilicon layer.

The device 200 may perform as a gate-all-around (GAA) device, the HK/MG stack 1010 being formed on multiple sides of the nanowire (the second epitaxy layer 316). The multi-gate device 200 is illustrated in isometric view in FIG. 19A and corresponding cross-sectional views in FIG. 20A (cross-sectional along line A-A), FIG. 20B (cross-sectional along line B-B through the gate structure 1010), FIG. 20C (cross-sectional along line BB-BB through the first through the S/D feature 870). The multi-gate device 200 is also illustrated in isometric view in FIG. 19B and corresponding cross-sectional views in FIG. 20A (cross-sectional along line A-A), FIG. 20D (cross-sectional along line B-B through the gate structure 1010), FIG. 20E (cross-sectional along line BB-BB through the S/D). The multi-gate device 200 is also illustrated in isometric view in FIG. 19C and corresponding cross-sectional views in FIG. 20F (cross-sectional along line A-A), FIG. 20G (cross-sectional along line B-B through the gate structure 1010), FIG. 20H (cross-sectional along line BB-BB through the S/D). The ILD layer 910 is removed for ease of reference in FIGS. 20A through 20H.

Figure 20A:
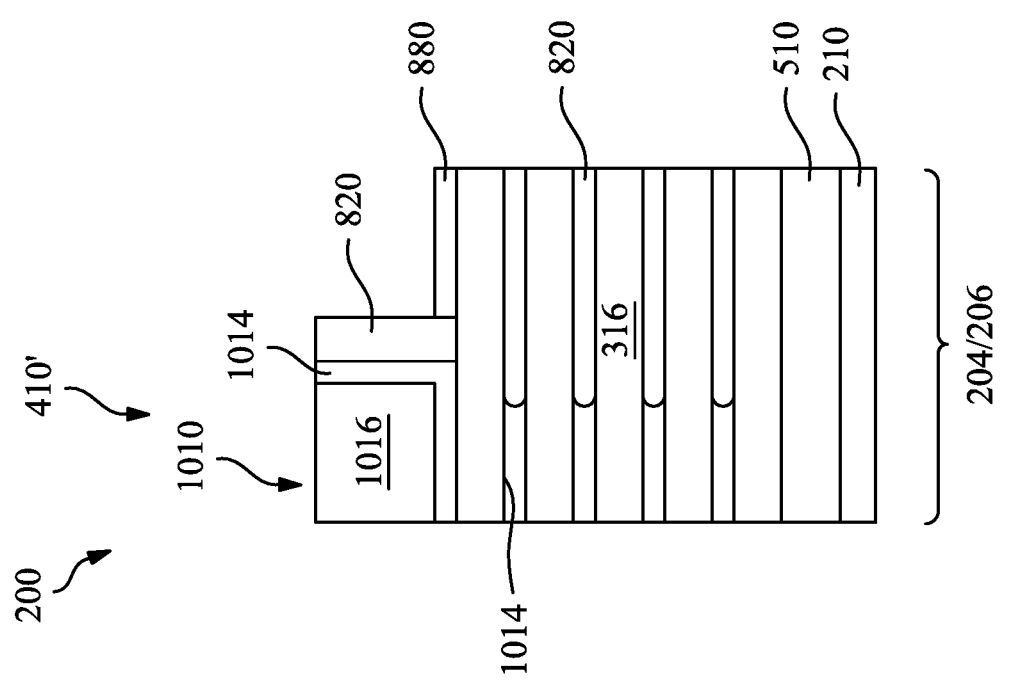
FIG. 20A is a cross-section views, corresponding to the isometric view of FIGS. 19A and 19B along lines A-A, of an embodiment of the device 200 according to aspects of the method of FIG. 1.

In the first region 202, as illustrated in FIGS. 20A and 20B, the gate dielectric layer 1014 is disposed below the second epitaxial layer 316 (e.g., nanowire). However, in other embodiments, other portions of the HK/MG stack 1010 (e.g., gate electrode 1016) may also be disposed under the second epitaxy layer 316. In some embodiments, the device 200 may be a FINFET device having a gate formed on at least two-sides of the channel region (e.g., top and two sidewalls). The device 200 in FIG. 20C illustrates the first S/D feature 870 having the epitaxially grown cladding layer 880 disposed on multiple surfaces of the second epitaxy layer 316 (e.g., nanowire), while dielectric layer 820 is disposed between second epitaxy layers 316. The first S/D feature 870 is formed over the first designated portion 840 (the upper portion) of the epitaxial stack 310 and the lower portion of the epitaxial stack 310 is covered by the spacer layer 820. The first S/D feature 870 is formed over the first designated portion 840 of the epitaxial stack 310 having multiple nanowires and each of the nanowire (the second epitaxial material 316) extends into the channel region, thereby forming a multi-channel, multi-source and drain region structure. In an embodiment, a five-channel, three-S/D region structure is formed in the first region 202.

In the second region 204, as illustrated in FIGS. 20A and 20D, the gate dielectric layer 1014 is disposed below the second epitaxial layer 316 (e.g., nanowire). However, in other embodiments, other portions of the HK/MG stack 1010 (e.g., gate electrode 1016) may also be disposed under the second epitaxy layer 316. In some embodiments, the device 200 may be a FINFET device having a gate formed on at least two-sides of the channel region (e.g., top and two sidewalls) and/or have other configurations known in the art. The device 200 in FIG. 20E illustrates the second S/D feature 875 having the epitaxially grown cladding layer 880 disposed on multiple surfaces of the second epitaxy layer 316 (e.g., nanowire), while dielectric layer 820 is disposed between epitaxy layers 316. The second S/D feature 875 is formed over the second designated portion 860 (the upper portion) of the epitaxial stack 310 having multiple nanowires and each of the nanowire (the second epitaxial material 316) extends into the channel region, thereby forming a multi-channel, multi-region structure. In the present embodiment, a mount of nanowires of the second designated portion is different than those of the first designated portion in the first region 202. In an embodiment, a five-channel, five-S/D region structure is formed.

Figure 20H:
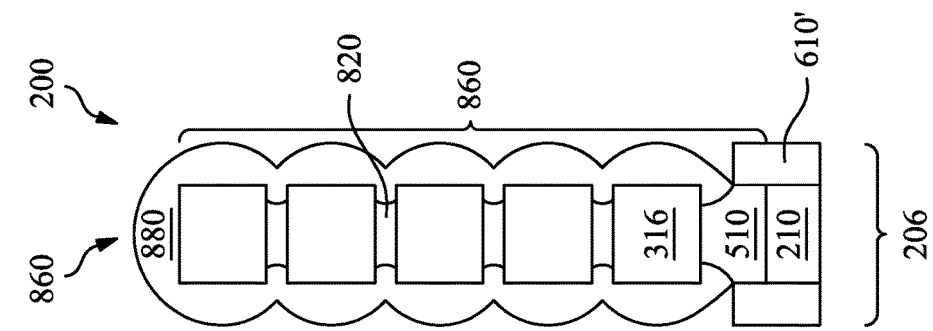
FIG. 20H is a cross-section views, corresponding to the isometric view of FIG. 19C along line BB-BB, of an embodiment of the device 200 according to aspects of the method of FIG. 1.
Figure 20G:
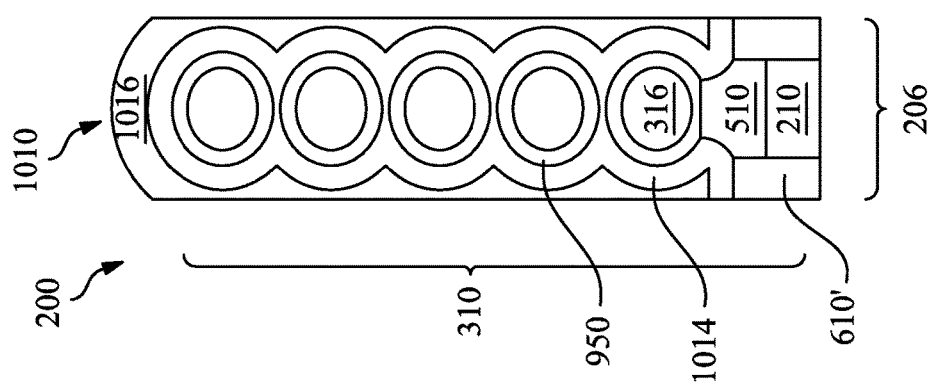
FIG. 20G is a cross-section views, corresponding to the isometric view of FIG. 19C along line B-B, of an embodiment of the device 200 according to aspects of the method of FIG. 1.
Figure 20F:
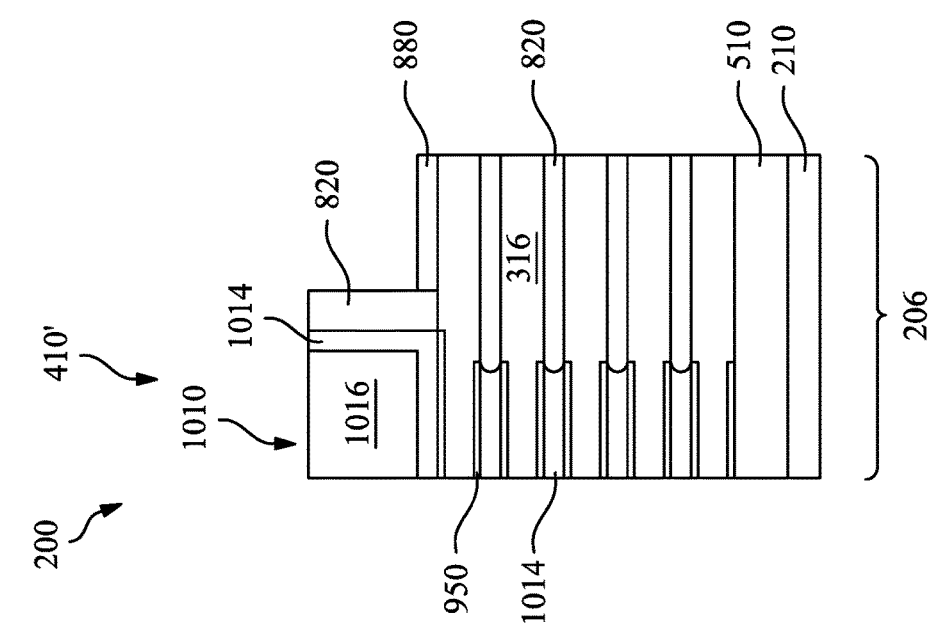
FIG. 20F is a cross-section views, corresponding to the isometric view of FIG. 19C along line A-A, of an embodiment of the device 200 according to aspects of the method of FIG. 1.

In the third region 206, as illustrated in FIGS. 20F and 20G, the I/O dielectric layer 950 wraps around the second epitaxial layer 316 (e.g., nanowire) and the gate dielectric layer 1014 is disposed below the I/O dielectric layer 950. The device 200 in FIG. 20H illustrates the second S/D feature 875 having the epitaxially grown cladding layer 880 disposed on multiple surfaces of the second epitaxy layer 316 (e.g., nanowire), while dielectric 820 is disposed between epitaxy layers 316. The second S/D feature 875 is formed over the second designated portion 860 of the epitaxial stack 310. In the present embodiment, the second S/D feature 875 is formed over five nanowires connecting to the HK/MG stack 1010.

Additional process steps may be implemented before, during, and after method 100, and some process steps described above may be replaced or eliminated in accordance with various embodiments of method 100.

Figure 21:
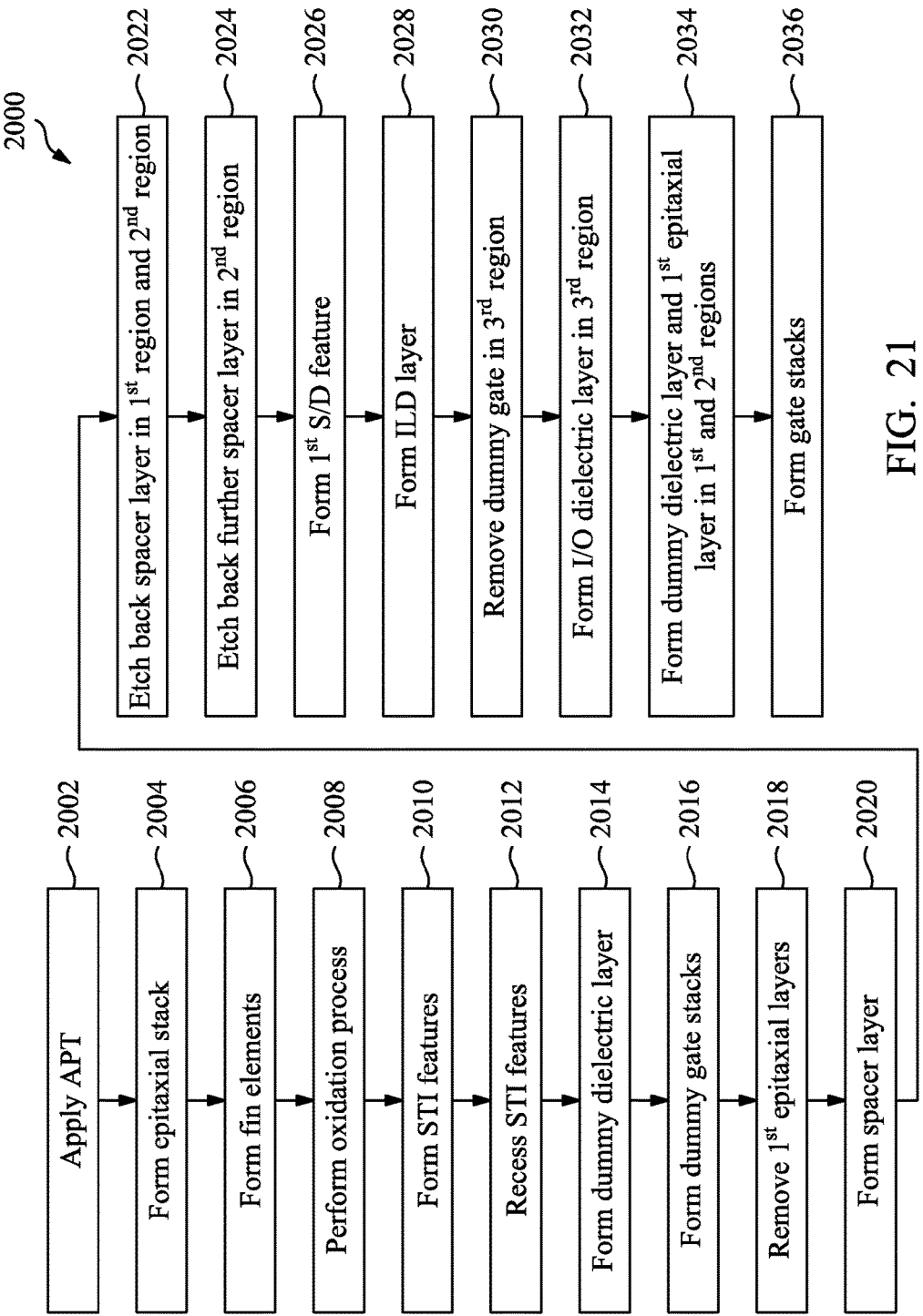
FIG. 21 is a flow chart of another method of fabricating a multi-gate device or portion thereof according to one or more aspects of the present disclosure.

Illustrated in FIG. 21 is a method 2000 of semiconductor fabrication including fabrication of the semiconductor device 200. The steps 2002 through 2020 are similar to those discussed above in steps 102 through 120 of method 100, respectively. Thus, the discussions above with respect to steps 102 through 120 are applicable to the steps 2002 through 2020, respectively. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 22:
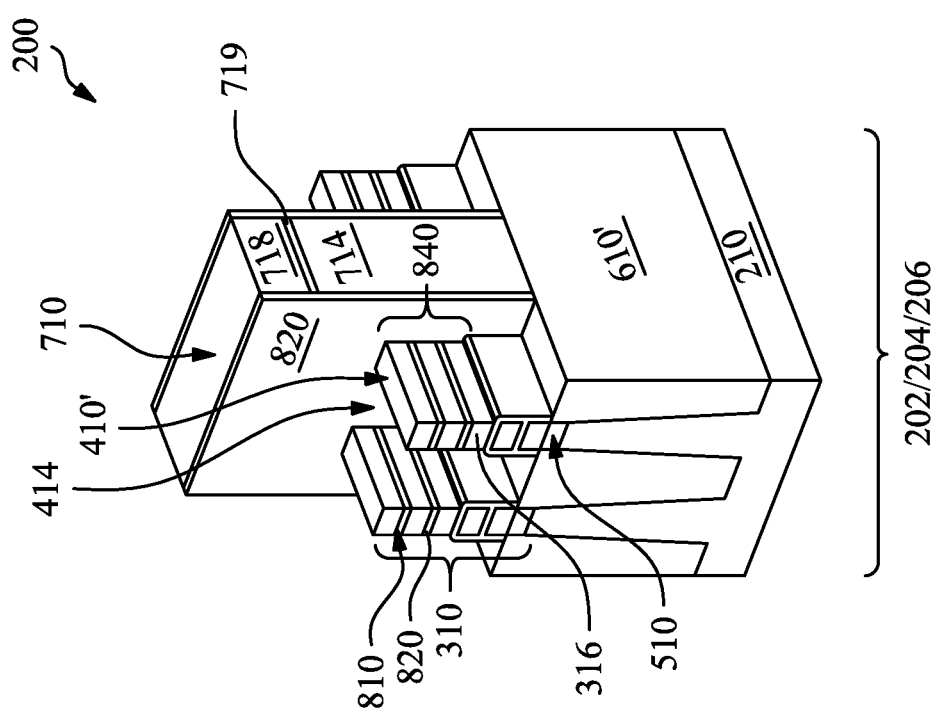
FIGS. 22 and 23 are isometric views of an embodiment of a device 200 according to aspects of the method of FIG. 21.

Referring to FIGS. 21 and 22, method 2000 proceeds to step 2022 by etching-back the spacer layer 820 in the first region 202, the second region 204 and the third region 206. The spacer layer 820 is etched similarly in many respects to the etching process discussed above with reference to step 122 of method 100 and/or the example of FIG. 12. In the present embodiment, the etching-back of the spacer layer 820 is controlled to be exposed the first designated portion of the epitaxial stack 310 in the S/D regions, which are adjacent to and associated with the dummy gate stack 710. In an embodiment, the first designated portion includes three epitaxial layers 316, referred to as the first S/D fin 840.

Figure 23:
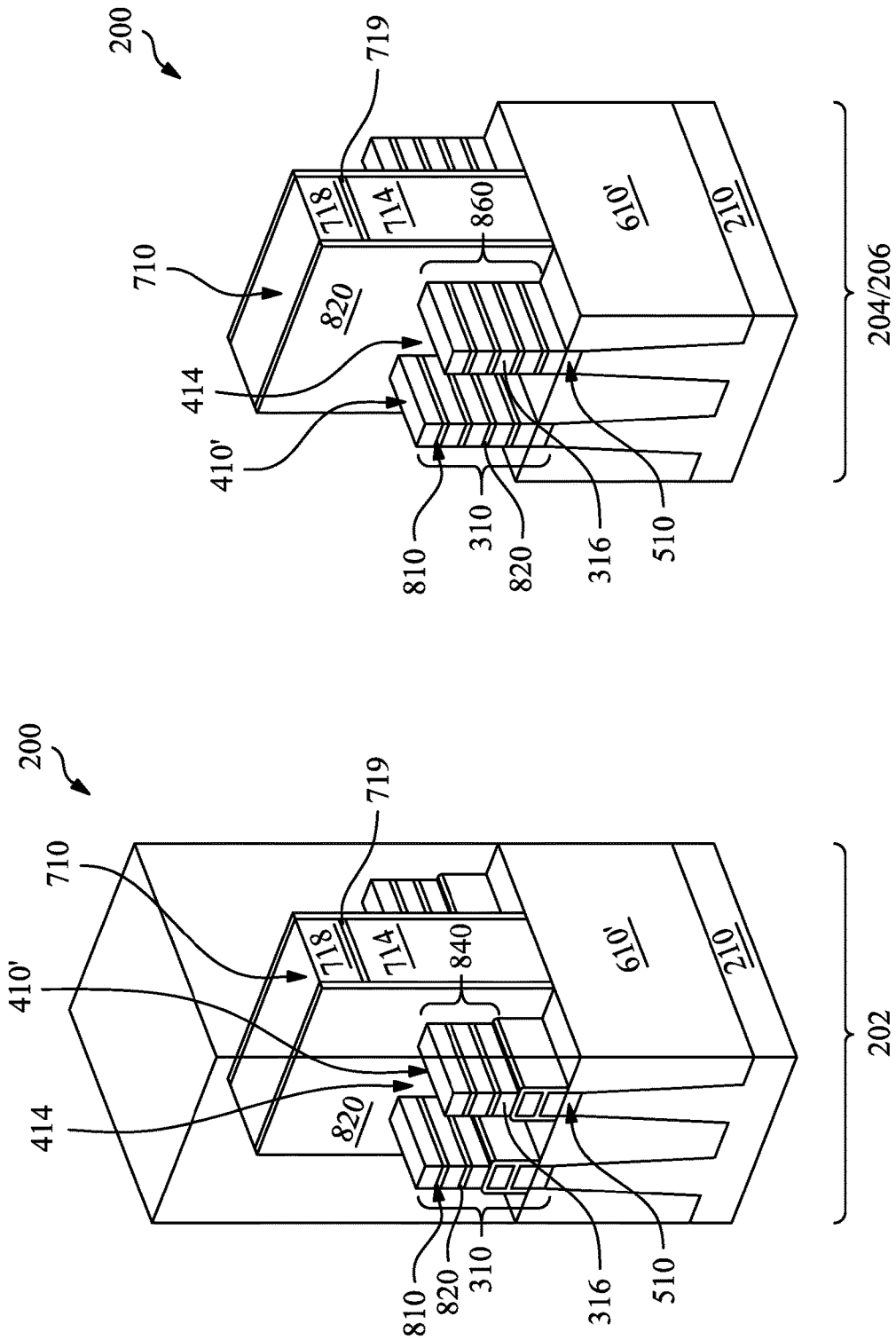

Referring to FIGS. 1 and 23, method 2000 proceeds to step 2024 by further etching-back the spacer layer 820 in the second region 204 and the third region 206, while covering the first region 202 with a first patterned HM 2830. The first patterned HM 2820 is formed similarly in many respects to the first patterned HM 830 discussed above with reference to step 122 of method 100 and/or the example of FIG. 12, including the materials discussed therein. The etching-back process is similar in many respects to the etching-back process discussed above with reference to step 122 of method 100 and/or the example of FIG. 12. In the present embodiment, the etching-back of the spacer layer 820 in the second region 204 is controlled to be exposed the second designated portion of the epitaxial stack 310 in the S/D regions. The second designated portions in the second region 204 and the third region 206 has different number of nanowires than the first designated portion in the first region 202. In an embodiment, the second designated portion includes five nanowires (five epitaxial layers 316), referred to as a second S/D fin 860.

After further etching back the spacer layer 820 in the second region 204 and the third region 206, the first patterned HM 2830 is removed by an etch process. In one example where the first patterned HM 2830 is a photoresist pattern, the first patterned HM 2830 is removed by wet stripping and/or plasma ashing.

The remaining steps of method 2000, 2026 through 2036, are same as steps 126 through 136 of method 100, respectively, including any descriptions given with reference to FIGS. 14 through 20H.

The semiconductor device 200 may undergo further CMOS or MOS technology processing to form various features and regions known in the art. For example, various contacts/vias and multilayers interconnect features (e.g., interlayer dielectrics) over the substrate 210, configured to connect the various features or structures of the semiconductor device 200.

Based on the above, it can be seen that the present disclosure provides methods of forming a multi-channel, multi-source/drain region structure. The method employs forming/etch-back a spacer layer to form source/drain regions with various S/D features from one region to another region of the device to meet device performance needs, such as manipulating channel currents. The method also provides feasible process of forming an input/output structure along with forming gate stack and source/drain structures.

The present disclosure provides many different embodiments of fabricating a semiconductor device that provide one or more improvements over existing approaches. In one embodiment, a method for fabricating a semiconductor device includes forming a first fin extending from a substrate. The first fin has a source/drain region and a channel region and the first fin is formed of a first stack of epitaxial layers that includes first epitaxial layers having a first composition interposed by second epitaxial layers having a second composition. The method also includes removing the second epitaxial layers from the source/drain region of the first fin to form first gaps, covering a portion of the first epitaxial layers with a dielectric layer and filling the first gaps with the dielectric material and growing another epitaxial material on at least two surfaces of each of the first epitaxial layers to form a first source/drain feature while the dielectric material fills the first gaps.

In another embodiment, a method includes forming a first fin extending from a substrate. The first fin has a first source and drain region and a first channel region, and the first fin includes a first stack of epitaxial layers that includes first epitaxial layers having a first composition interposed by second epitaxial layers having a second composition. The method also includes forming a second fin extending from the substrate, the second fin having a second source and drain region and a second channel region. The second fin includes a second stack of epitaxial layers that includes first epitaxial layers having the first composition interposed by second epitaxial layers having the second composition. The method also includes removing the second epitaxial layers from the first source/drain region to form first gaps and from the second source/drain region to form second gaps, covering a lower portion of the first stack with a dielectric layer and filling the first gaps in an upper portion of the first stack with the dielectric material, covering a lower portion of the second stack with the dielectric layer and filling the second gaps in an upper portion of the second stack with the dielectric material. The upper portion of the second stack includes different amount of first epitaxial layers than the upper portion of the first stack. The method also includes growing another epitaxial material on at least two surfaces of each of the first epitaxial layers to form a first source/drain feature and a second source/drain feature, respectively, while the dielectric material fills the first gaps and second gaps.

In yet another embodiment, a device includes a first fin element extending from a substrate, a first gate structure extending over a first channel region of the first fin element. The channel region of the first fin element includes a plurality of channel semiconductor layers each surrounded by a portion of the first gate structure. The device also includes a first source/drain region of the first fin element adjacent the first gate structure. The first source/drain region includes a first plurality of first semiconductor layers, a dielectric layer over the first semiconductor layer and a second semiconductor layer cladding the first semiconductor layer and interfacing with sidewalls of the dielectric layer. The device also includes a second fin element extending from the substrate, a second gate structure extending over a second channel region of the second fin element. The channel region of the second fin element includes a plurality of channel semiconductor layers each surrounded by a portion of the second gate structure and a second source/drain region of the second fin element adjacent the second gate structure. The second source/drain region includes a second plurality of first semiconductor layers. The second plurality of first semiconductor layers has a different amount of first semiconductor layer than the first plurality of the first semiconductor layers. The second source/drain region also includes the dielectric layer over the first semiconductor layer and the second semiconductor layer cladding the first semiconductor layer and interfacing with sidewalls of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first fin and a second fin disposed over a substrate;
   a first gate structure disposed over the first fin, the first gate structure including:
     a first gate dielectric layer; and
     a first semiconductor layer having a top surface facing away from the substrate, wherein the first gate dielectric layer covers at least a portion of the top surface of the first semiconductor layer;
   a first source/drain feature disposed over the first fin, the first source/drain feature including:
     the first semiconductor layer;
     a second semiconductor layer disposed over the first semiconductor layer; and
     a first spacer dielectric layer disposed along a sidewall of the first semiconductor layer without extending to a sidewall of the second semiconductor layer;
   a second gate structure disposed over the second fin, the second gate structure including:
     a second gate dielectric layer; and
     a third semiconductor layer disposed over the second gate dielectric layer; and
   a second source/drain feature disposed over the second fin, the second source/drain feature including:
     the third semiconductor layer;
     a fourth semiconductor layer disposed over the third semiconductor layer; and a second spacer dielectric layer extending from a top surface of the third semiconductor layer to a bottom surface of the fourth semiconductor layer, the top surface of the third semiconductor layer facing away from the substrate and the bottom surface of the fourth semiconductor layer facing the substrate.

2. The device of claim 1, wherein the first source/drain feature further includes a conductive layer disposed along the sidewall of the second semiconductor layer.

3. The device of claim 2, wherein the first spacer dielectric layer extends from another portion of the top surface of the first semiconductor layer to a bottom surface of the second semiconductor layer, the bottom surface of the second semiconductor layer facing the substrate.

4. The device of claim 3, wherein the conductive layer physically contacts the first spacer dielectric layer extending from the another portion of the top surface of the first semiconductor layer to the bottom surface of the second semiconductor layer.

5. The device of claim 1, wherein the first gate structure further includes an oxidized semiconductor layer disposed over the first fin and the first semiconductor layer physically contacts the oxidized semiconductor layer.

6. The device of claim 1, wherein the first gate structure further includes a third gate dielectric layer disposed over the first gate dielectric layer.

7. The device of claim 1, wherein the second source/drain feature further includes an oxidized semiconductor layer disposed over the second fin and the third semiconductor layer physically contacts the oxidized semiconductor layer.

8. The device of claim 1, wherein the second source/drain feature further includes a conductive layer extending along sidewall of the third and fourth semiconductor layers.

9. The device of claim 1, wherein the first semiconductor layer and the second semiconductor layer are formed of the same semiconductor material, and
wherein the third semiconductor layer and the fourth semiconductor layer are formed of the same semiconductor material.

10. A device comprising:
a first gate structure disposed over a first fin on a substrate, the first gate structure including:
a first semiconductor layer having a top surface facing away from the substrate and a bottom surface facing the substrate; and
a first gate dielectric layer covering at least a portion of the top surface and at least at a portion of the bottom surface of the first semiconductor layer; and
a first source/drain feature disposed over the first fin, the first source/drain feature including:
the first semiconductor layer;
a second semiconductor layer disposed over the first semiconductor layer;
a first spacer dielectric layer disposed along a sidewall of the first semiconductor layer; and
a first conductive layer disposed along a sidewall of the second semiconductor layer; and
a second gate structure disposed over a second fin on the substrate, the second gate structure including:
a third semiconductor layer having a top surface facing away from the substrate and a bottom surface facing the substrate; and
a second gate dielectric layer covering at least a portion of the top surface and at least at a portion of the bottom surface of the third semiconductor layer; and
a second source/drain feature disposed over the second fin, the second source/drain feature including:
the third semiconductor layer;
a fourth semiconductor layer disposed over the third semiconductor layer;
a second spacer dielectric layer disposed between the third semiconductor layer and the fourth semiconductor layer; and
a second conductive layer disposed along a sidewall of the third semiconductor layer and along a sidewall of the fourth semiconductor layer.

11. The device of claim 10, wherein the first spacer dielectric layer physically contacts the sidewall of the first semiconductor layer, and
wherein the first conductive layer physically contacts the sidewall of the second semiconductor layer.

12. The device of claim 10, wherein the second conductive layer physically contacts the sidewall of the third semiconductor layer and the sidewall of the fourth semiconductor layer.

13. The device of claim 10, further comprising:
a third gate structure extending over a third fin, the third gate structure including:
a fifth semiconductor layer having a top surface facing away from the substrate a bottom surface facing the substrate; and
a third gate dielectric layer covering at least a portion of the top surface and at least at a portion of the bottom surface of the fifth semiconductor layer; and
a fourth gate dielectric layer disposed directly on the third gate dielectric layer and surrounding the fifth semiconductor layer.

14. The device of claim 10, further comprising a shallow trench isolation structure disposed within the substrate, and
wherein the first spacer dielectric layer physically contacts the shallow trench isolation structure.

15. The device of claim 14, wherein the first gate dielectric layer physically contacts the shallow trench isolation structure.

16. The device of claim 10, wherein the second source/drain feature further includes an oxidized semiconductor layer disposed over the second fin, and
wherein the second conductive layer extends from the fourth semiconductor layer to the oxidized semiconductor layer.

17. The device of claim 10, wherein the a second semiconductor layer has a bottom surface facing the substrate, and
wherein the first spacer dielectric layer physically contacts a first portion of the bottom surface of the second semiconductor layer and the first conductive layer physically contacts a second portion of the bottom surface of the second semiconductor layer.

18. A device comprising:
a first fin element extending from a substrate;
a first gate structure extending over a first channel region of the first fin element, wherein the channel region of the first fin element includes a plurality of channel semiconductor layers each surrounded by a portion of the first gate structure;
a first source/drain region of the first fin element adjacent the first gate structure, wherein the first source/drain region includes:
a first plurality of first semiconductor layers;
a dielectric layer over the first semiconductor layer; and
a second semiconductor layer cladding the first semiconductor layer and interfacing with sidewalls of the dielectric layer;
a second fin element extending from the substrate;

a second gate structure extending over a second channel region of the second fin element, wherein the channel region of the second fin element includes a plurality of channel semiconductor layers each surrounded by a portion of the second gate structure;

a second source/drain region of the second fin element adjacent the second gate structure, wherein the second source/drain region includes:

a second plurality of first semiconductor layers, wherein the second plurality of first semiconductor layers has a different amount of first semiconductor layer than the first plurality of the first semiconductor layers;

the dielectric layer over the first semiconductor layer; and the second semiconductor layer cladding the first semiconductor layer and interfacing with sidewalls of the dielectric layer.

19. The device of claim 18, wherein the first semiconductor layer includes Si, the dielectric layer includes oxidized SiGe, the second semiconductor layer includes Si.

20. The device of claim 18, further comprising:

a third fin element extending from the substrate;

a third channel region of the first fin element, wherein the third channel region includes:

a plurality of channel semiconductor layers each surrounded by an input/output dielectric layer;

a third gate structure over the input/output dielectric layer;

a third source/drain region of the third fin element adjacent the third channel region, wherein the first source/drain region includes:

a third plurality of first semiconductor layers;

a dielectric layer over the first semiconductor layer; and the second semiconductor layer cladding the first semiconductor layer and interfacing with sidewalls of the dielectric layer.

* * * * *